US010553298B1

(12) United States Patent
Zhao et al.

(10) Patent No.: US 10,553,298 B1
(45) Date of Patent: Feb. 4, 2020

(54) NON-VOLATILE MEMORY WITH COUNTERMEASURE FOR SELECT GATE DISTURB

(71) Applicant: SANDISK TECHNOLOGIES LLC, Addison, TX (US)

(72) Inventors: Dengtao Zhao, Santa Clara, CA (US); Deepanshu Dutta, Fremont, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/047,599

(22) Filed: Jul. 27, 2018

(51) Int. Cl.
*G11C 16/10* (2006.01)
*G11C 16/34* (2006.01)
*H01L 27/11582* (2017.01)
*G11C 16/04* (2006.01)
*G11C 16/08* (2006.01)

(52) U.S. Cl.
CPC ...... *G11C 16/3459* (2013.01); *G11C 16/0466* (2013.01); *G11C 16/0483* (2013.01); *G11C 16/08* (2013.01); *G11C 16/10* (2013.01); *H01L 27/11582* (2013.01)

(58) Field of Classification Search
CPC ............ G11C 16/3459; G11C 16/0466; G11C 16/0483; G11C 16/08; G11C 16/10; H01L 27/11582
USPC ....................................... 365/185.02–185.33
See application file for complete search history.

(56) References Cited

U.S. PATENT DOCUMENTS

| | | | |
|---|---|---|---|
| 6,859,397 B2 | 2/2005 | Lutze | |
| 7,355,889 B2 | 4/2008 | Hemink | |
| 7,433,241 B2 | 10/2008 | Dong | |
| 7,440,323 B2 | 10/2008 | Lutze | |
| 7,460,404 B1 | 12/2008 | Dong | |
| 7,463,531 B2 | 12/2008 | Hemink | |
| 7,489,547 B2 * | 2/2009 | Moogat | G11C 11/5628 365/185.03 |
| 7,489,548 B2 * | 2/2009 | Moogat | G11C 16/3418 365/185.17 |
| 7,623,386 B2 | 11/2009 | Dong | |

(Continued)

OTHER PUBLICATIONS

Chen, et al., "Reducing Hot Electron Injection Type of Read Disturb in 3D Memory Device Having Connected Source-End Select Gates," U.S. Appl. No. 15/678,683.

(Continued)

*Primary Examiner* — Harry W Byrne
(74) *Attorney, Agent, or Firm* — Vierra Magen Marcus LLP

(57) ABSTRACT

Program disturb is a condition that includes the unintended programming while performing a programming process for other memory cells. Such unintended programming can cause an error in the data being stored. In some cases, program disturb can result from electrons trapped in the channel being accelerated from one side of a dummy word line to another side of the dummy word line and redirected into a select gate. To prevent such program disturb, it is proposed to open the channel from one side of the dummy word line to the other side of the dummy word line after a sensing operation for program verify and prior to a subsequent programming voltage being applied. For example, the channel can be opened up by applying a voltage to the dummy word line prior to pre-charging unselected memory cells.

15 Claims, 17 Drawing Sheets

(56) References Cited

U.S. PATENT DOCUMENTS

| | | |
|---|---|---|
| 7,852,675 B2 | 12/2010 | Maejima |
| 8,537,617 B2 | 9/2013 | Kim |
| 8,670,285 B2 | 3/2014 | Dong |
| 9,093,157 B2 | 7/2015 | Kwak |
| 9,171,632 B2 | 10/2015 | Dong |
| 9,286,987 B1 | 3/2016 | Dong |
| 9,286,994 B1 | 3/2016 | Chen |
| 9,336,892 B1 | 5/2016 | Chen |
| 9,361,993 B1 | 6/2016 | Chen |
| 9,406,391 B1 | 8/2016 | Chen |
| 9,412,463 B1 | 8/2016 | Chen |
| 9,440,273 B2 | 9/2016 | McMillen |
| 9,466,369 B1 | 10/2016 | Pang |
| 9,530,506 B2 | 12/2016 | Rabkin |
| 9,640,273 B1 | 5/2017 | Chen |
| 9,691,781 B1 | 6/2017 | Nishikawa |
| 9,704,588 B1 | 7/2017 | Ray |
| 9,747,992 B1 | 8/2017 | Chen |
| 9,761,320 B1 | 9/2017 | Chen |
| 9,887,002 B1 | 2/2018 | Zhang |
| 9,905,305 B2 | 2/2018 | Chen |
| 9,922,705 B1 | 3/2018 | Diep |
| 2008/0158968 A1* | 7/2008 | Moogat ............... G11C 11/5628 365/185.17 |
| 2008/0158969 A1* | 7/2008 | Moogat ............... G11C 16/3418 365/185.17 |
| 2008/0186776 A1 | 8/2008 | Kim |
| 2013/0088918 A1 | 4/2013 | Maejima |
| 2013/0201760 A1 | 8/2013 | Dong |
| 2013/0242667 A1 | 9/2013 | Shim |
| 2016/0148691 A1 | 5/2016 | Rabkin |
| 2017/0352430 A1 | 12/2017 | Chen |

OTHER PUBLICATIONS

Chen, et al., "Reducing Program Disturb by Modifying Word Line Voltages at Interface in Two-Tier Stack After Program-Verify," U.S. Patent Application No.

Chen, et al., "Reducing Hot Electron Injection Type of Read Disturb During Read Recovery Phase in 3D Memory," U.S. Appl. No. 15/383,852, filed Dec. 19, 2016.

Diep, et al., "Programming of Dummy Memory Cell to Reduce Charge Loss in Select Gate Transistor," U.S. Appl. No. 15/693,982, filed Sep. 1, 2017.

Yu, et al., "Reducing Disturbs With Delayed Ramp Up of Dummy Word Line After Pre-Charge During Programming," U.S. Appl. No. 15/726,686, filed Oct. 6, 2017.

* cited by examiner

|              | S0 | S1 | S2 | S3 | S4 | S5 | S6 | S7 |
|--------------|----|----|----|----|----|----|----|----|
| Upper Page   | 1  | 1  | 1  | 0  | 0  | 0  | 0  | 1  |
| Middle Page  | 1  | 1  | 0  | 0  | 1  | 1  | 0  | 0  |
| Lower Page   | 1  | 0  | 0  | 0  | 0  | 1  | 1  | 1  |

NON-VOLATILE MEMORY WITH COUNTERMEASURE FOR SELECT GATE DISTURB

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device, client, user or other entity. It is important that when data stored in the memory system is read back and reported to the host device, client, user or other entity, the data is reported back accurately.

BRIEF DESCRIPTION OF THE DRAWINGS

Like-numbered elements refer to common components in the different figures.

DETAILED DESCRIPTION

Program disturb is a condition that includes the unintended programming of one or more locations in a memory system while performing a programming process for other locations in the memory system. Such unintended programming can cause an error in the data being stored. In some cases, program disturb can result from electrons trapped in the channel being accelerated from one side of a dummy word line to another side of the dummy word line and redirected into a select gate. To prevent such program disturb, a countermeasure is proposed to open the channel from one side of the dummy word line to the other side of the dummy word line (e.g., from the source side of the dummy word line to the drain side of the dummy word line) after a sensing operation for program verify and prior to a subsequent programming signal being applied. For example, the channel can be opened up by applying a voltage to the dummy word line prior to pre-charging at the beginning of the programming process.

One embodiment includes a non-volatile storage system comprising a plurality of non-volatile memory cells including a first set of memory cells and a second set of memory cells, a plurality of word lines connected to the memory cells, and a control circuit connected to the word lines. The second set of memory cells includes a select gate and a dummy memory cell. The control circuit is configured to program a memory cell of the first set of memory cells connected to a selected word line and inhibit programming for a memory cell of the second set of memory cells connected to the selected word line by applying a programming signal to the selected word line and applying boosting signals to unselected word lines to boost a channel for the second set of memory cells. The control circuit is further configured to pre-charge the channel for the second set of the memory cells prior to the applying the boosting signals by applying a selection voltage to the select gate while applying one or more pre-charge voltages to at least a subset of the unselected word lines and turning on the dummy memory cell prior to applying the selection voltage to the select gate and/or prior to applying one or more pre-charge voltages.

Figure 1:
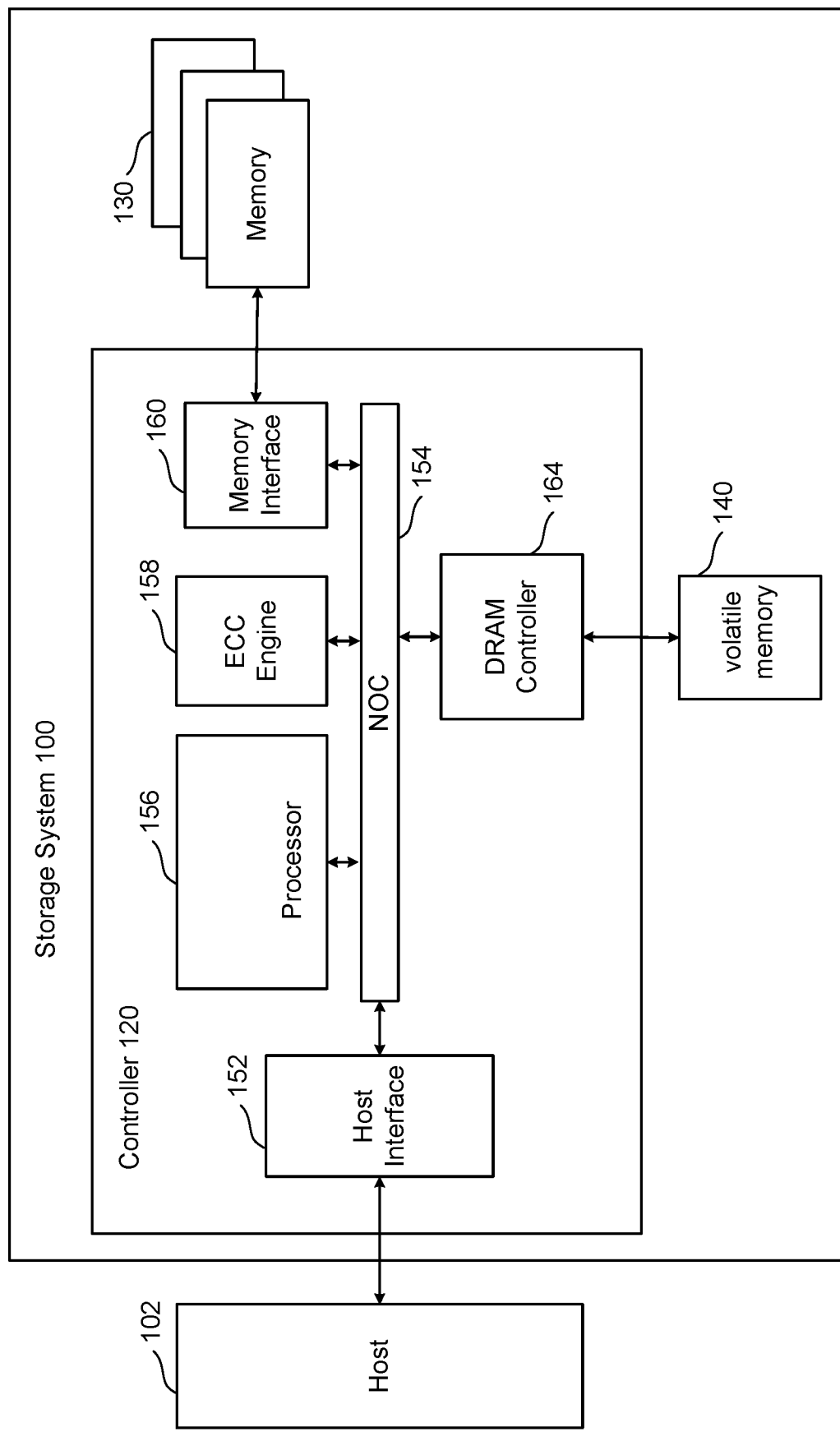
FIG. 1 is a block diagram depicting one embodiment of a memory system.

FIG. 1 is a block diagram of one embodiment of a memory system 100 that implements the proposed technology, including the countermeasure for avoiding program disturb to the select gate discussed in detail below. In one embodiment, storage system 100 is a solid state drive ("SSD"). Memory system 100 can also be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 120 connected to one or more memory die 130 and local high speed volatile memory 140 (e.g., DRAM). The one or more memory die 130 each comprise a plurality of non-volatile memory cells. More information about the structure of each memory die 130 is provided below with respect to FIG. 2. Local high speed volatile memory 140 is used by controller 120 to perform certain functions. For example, local high speed volatile memory 140 stores logical to physical address translation tables ("L2P tables.")

Controller 120 comprises a host interface 152 that is connected to and in communication with host 102. In one embodiment, host interface 152 provides a PCIe interface. Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, as well as memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To enable this system, the controller (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with one or more memory die 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2:
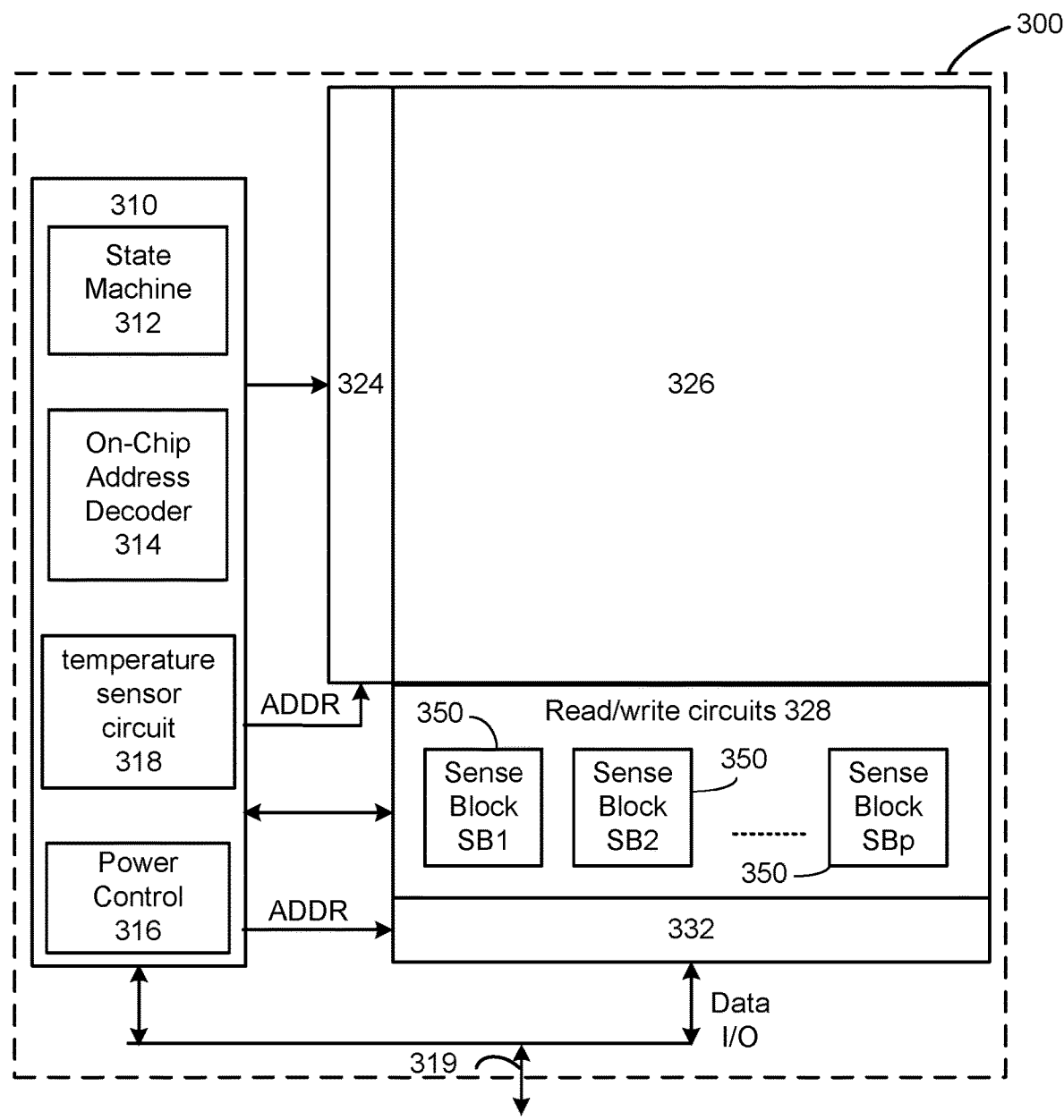
FIG. 2 is a block diagram of one embodiment of a memory die.

FIG. 2 is a functional block diagram of one embodiment of a memory die 300. Each of the one or more memory die 130 of FIG. 1 can be implemented as memory die 300 of FIG. 2. The components depicted in FIG. 2 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed (written) in parallel. In one embodiment, each sense block include a sense amplifier and a set of latches connected to the bit line. The latches store data to be written and/or data that has been read. The sense amplifiers include bit line drivers. Commands and data are transferred between the controller and the memory die 300 via lines 319. In one embodiment, memory die 300 includes a set of input and/or output (I/O) pins that connect to lines 118.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature sensor circuit 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters. Temperature sensor circuit 318 detects current temperature at memory die 300.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, read/write circuits 328 and decoders 324/332 comprise one embodiment of a control circuit for memory structure 326. In other embodiments, other circuits that support and operate on memory structure 326 can be referred to as a control circuit. For example, in some embodiments, the controller can operate as the control circuit or can be part of the control circuit.

In one embodiment, memory structure 326 comprises a three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. A NAND string includes memory cells connected by a channel.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
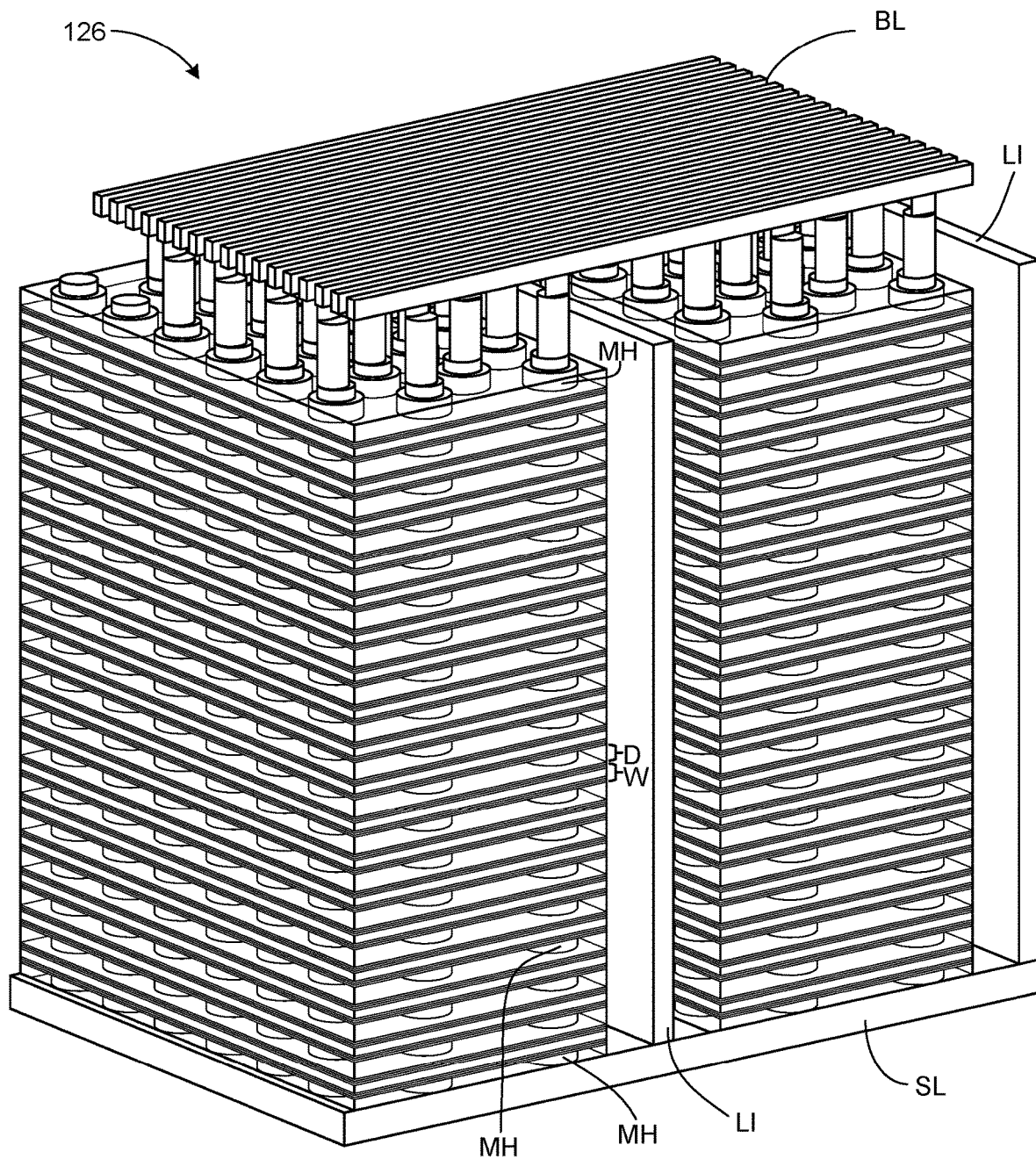
FIG. 3 is a perspective view of a portion of one embodiment of a monolithic three dimensional memory structure.

FIG. 3 is a perspective view of a portion of one example embodiment of a monolithic three dimensional memory array that can comprise memory structure 326, which includes a plurality non-volatile memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" by local interconnects LI. FIG. 3 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 126 is provided below with respect to FIG. 4A-4F.

Figure 4A:
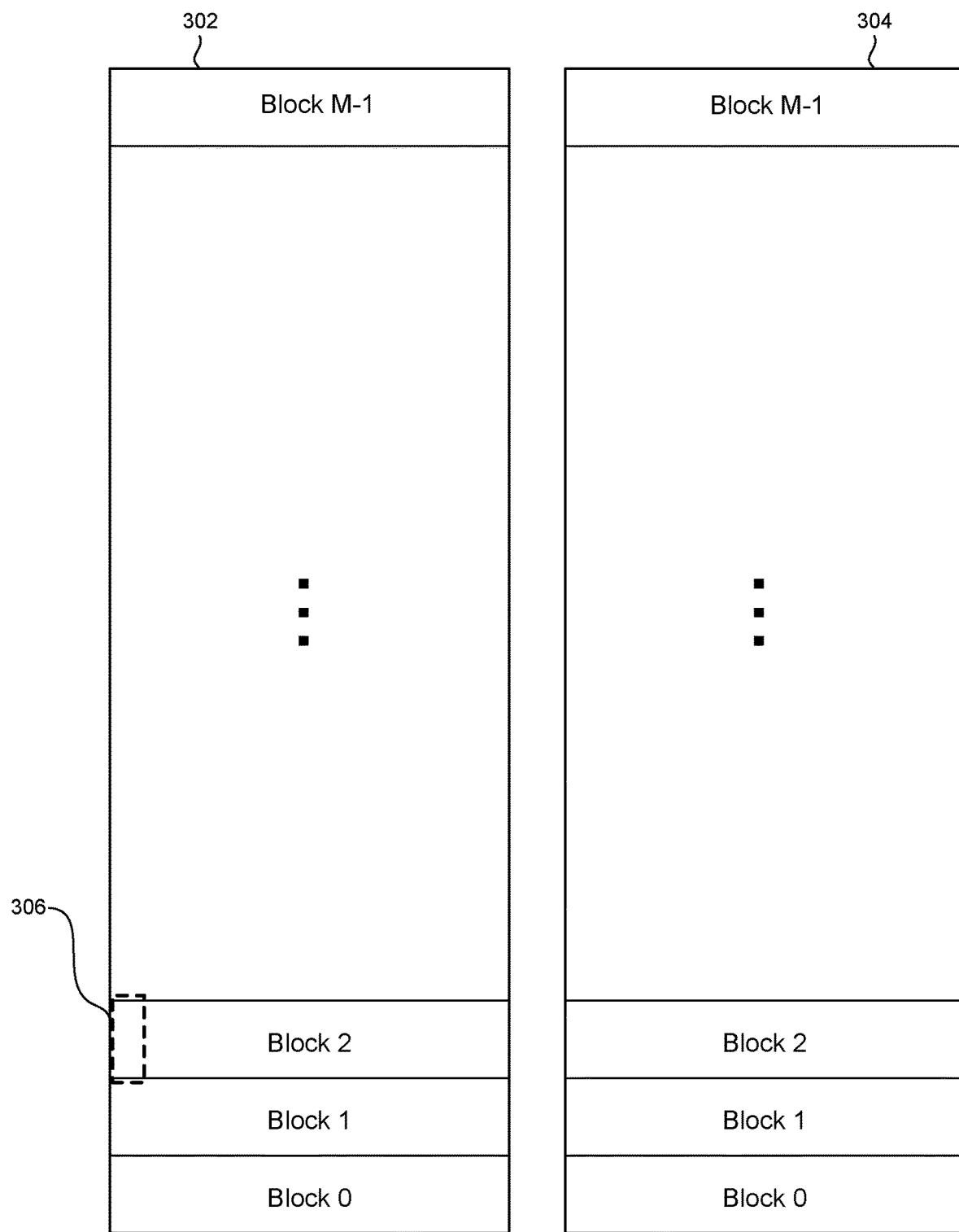
FIG. 4A is a block diagram of a memory structure having two planes.

FIG. 4A is a block diagram explaining one example organization of memory structure 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of word lines.

Figure 4B:
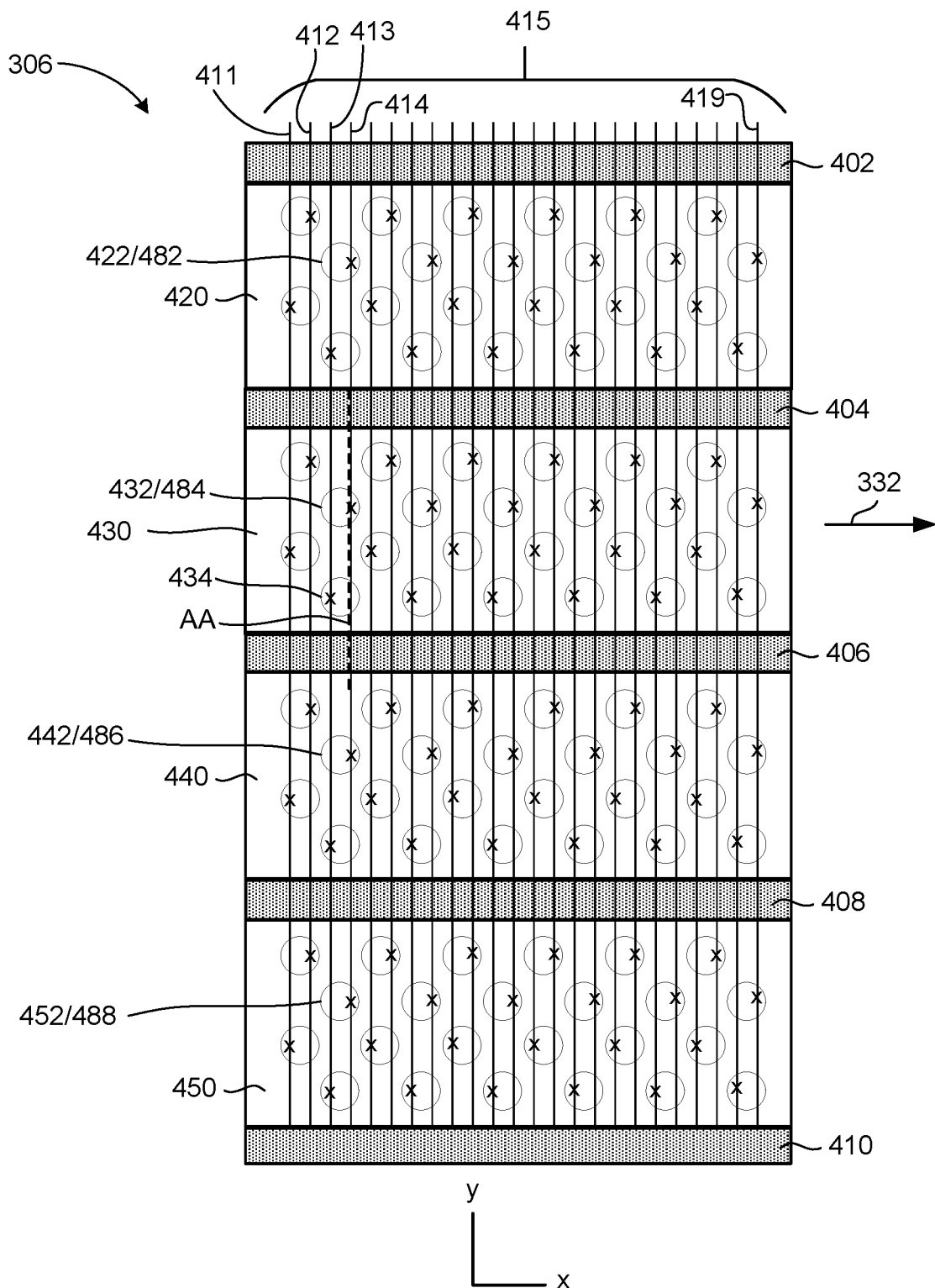
FIG. 4B depicts a top view of a portion of a block of memory cells.

FIGS. 4B-4F depict an example three dimensional ("3D") NAND structure that corresponds to the structure of FIG. 3 and can be used to implement memory structure 326 of FIG. 2. FIG. 4B is a block diagram depicting a top view of a portion of one block from memory structure 326. The portion of the block depicted in FIG. 4B corresponds to portion 306 in block 2 of FIG. 4A. As can be seen from FIG.

4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
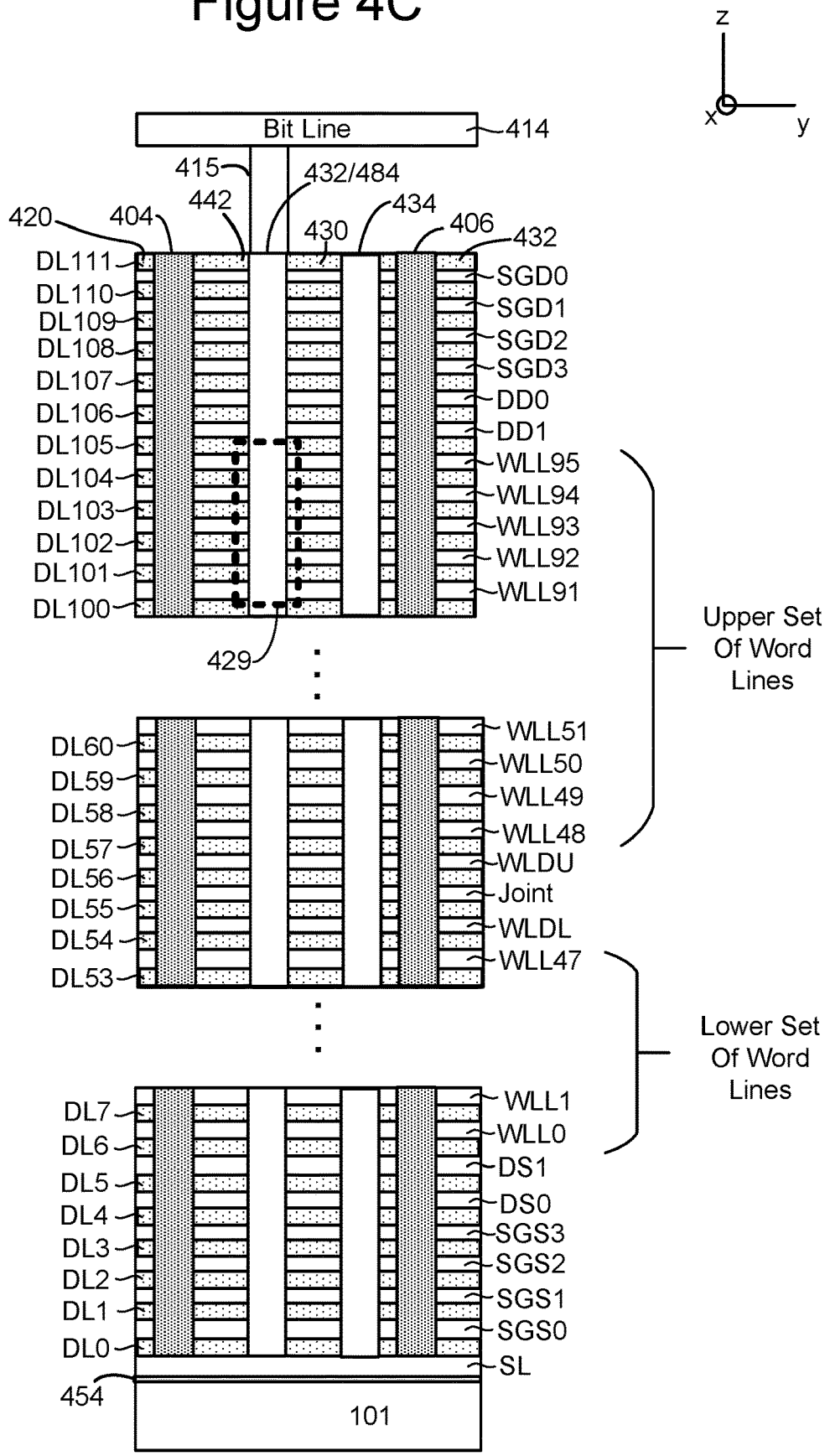
FIG. 4C depicts a cross sectional view of a portion of a block of memory cells.

FIG. 4C depicts a portion of one embodiment of a three dimensional memory structure 326 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety six data word line layers WLL0-WLL95 for connecting to data memory cells. Other embodiments can implement more or less than four drain side select layers, more or less than four source side select layers, more or less than six dummy word line layers, and more or less than ninety six word lines. Vertical columns 432 and 434 are depicted protruding through the drain side select layers, source side select layers, dummy word line layers and word line layers. In one embodiment, each vertical column comprises a vertical NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL95 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL111. For example, dielectric layers DL104 is above word line layer WLL94 and below word line layer WLL95. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a Joint area. In one embodiment it is expensive and/or challenging to etch ninety six word line layers intermixed with dielectric layers. To ease this burden, one embodiment includes laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect to the first stack to the second stack. In FIG. 4C, the first stack is labeled as the "Lower Set of Word Lines" and the second stack is labeled as the "Upper Set of Word Lines." In one embodiment, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
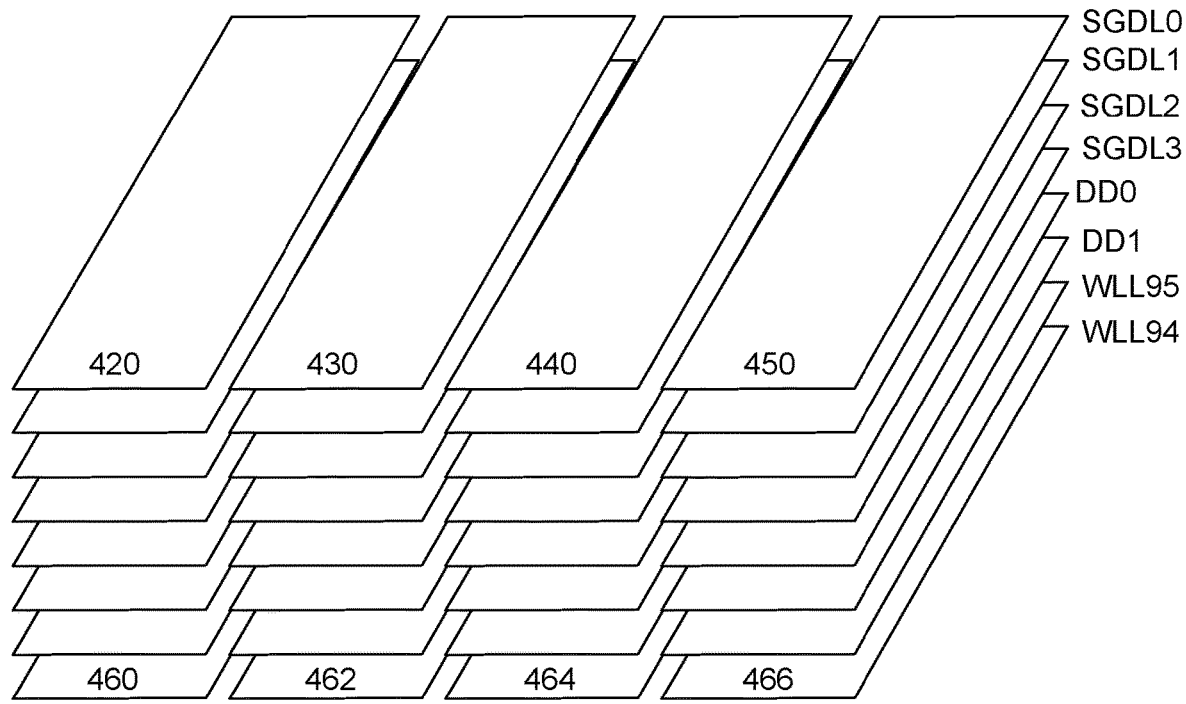
FIG. 4D depicts a view of the select gate layers and word line layers.
Figure 4D:
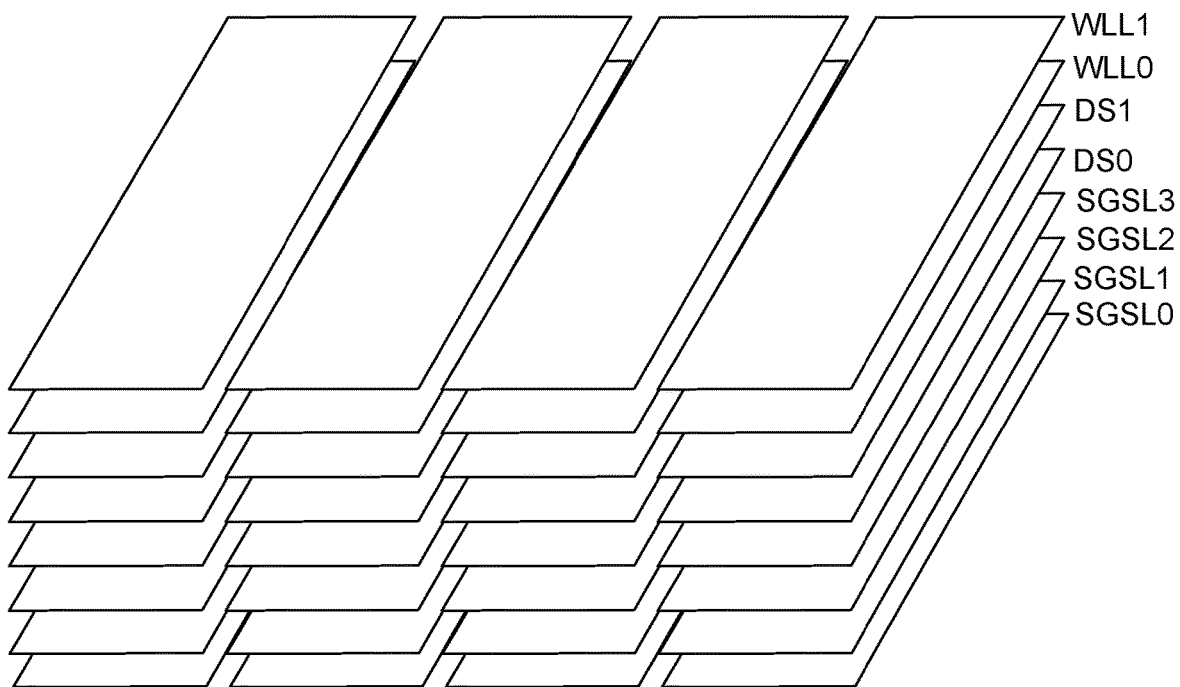

FIG. 4D depicts a logical representation of the conductive layers (SGD0, SGD1, SGD2, SGD3, SGS0, SGS1, SGS2, SGS3, DD0, DD1, DS0, DS1, and WLL0-WLL95) for the block that is partially depicted in FIG. 4C. As mentioned above with respect to FIG. 4B, in one embodiment local interconnects 402, 404, 406, 408 and 410 break up the conductive layers into four regions/fingers (or sub-blocks). For example, word line layer WLL94 is divided into regions 460, 462, 464 and 466. For word line layers (WLL0-WLL127), the regions are referred to as word line fingers; for example, word line layer WLL126 is divided into word line fingers 460, 462, 464 and 466. For example, region 460 is one word line finger on one word line layer. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
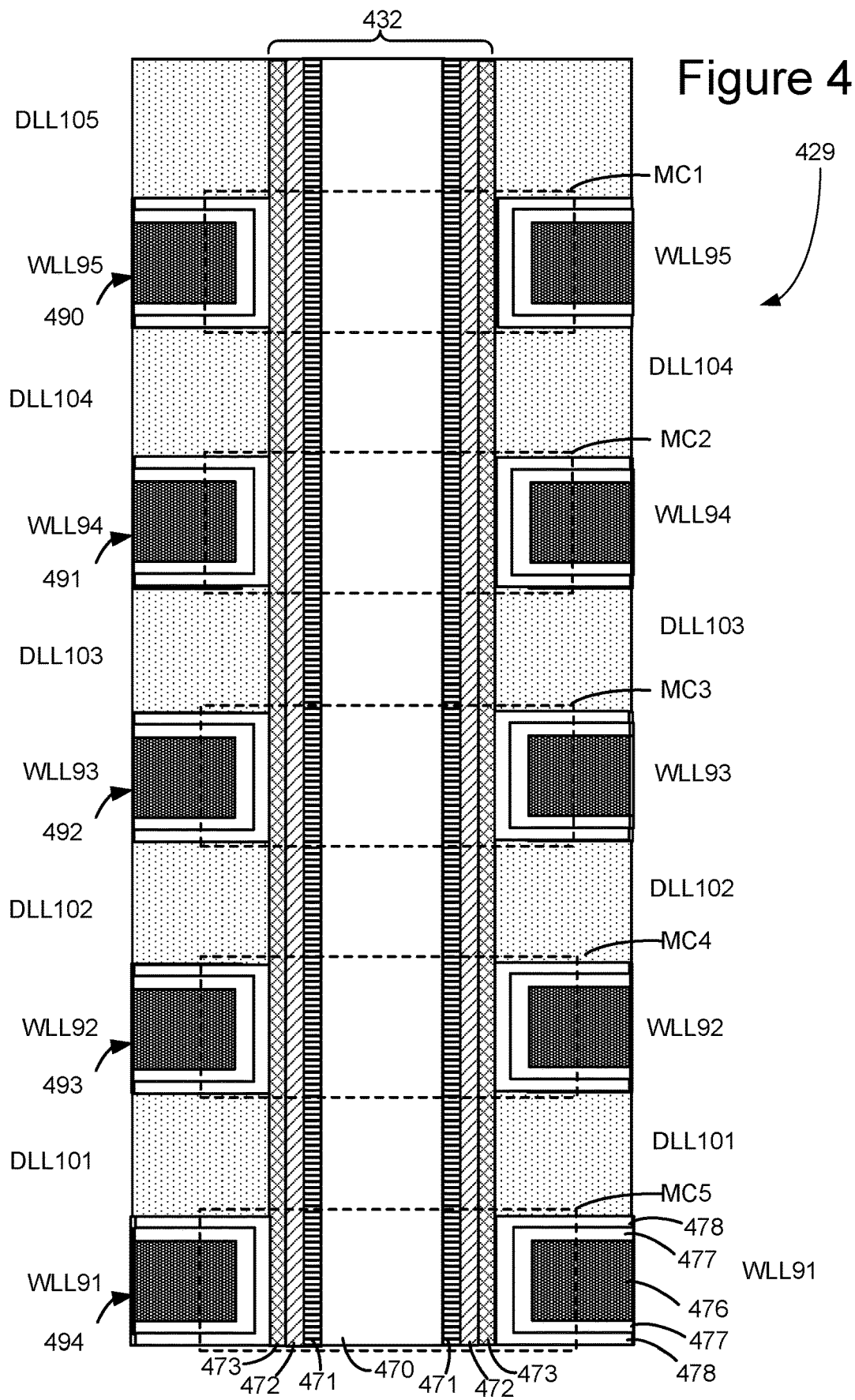
FIG. 4E is a cross sectional view of a vertical column of memory cells.

FIG. 4E depicts a cross sectional view of region 429 of FIG. 4C that includes a portion of vertical column 432 (a memory hole). In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL105, DLL104, DLL103, DLL102 and DLL101, as well as word line layers WLL95, WLL94, WLL93, WLL92, and WLL91. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
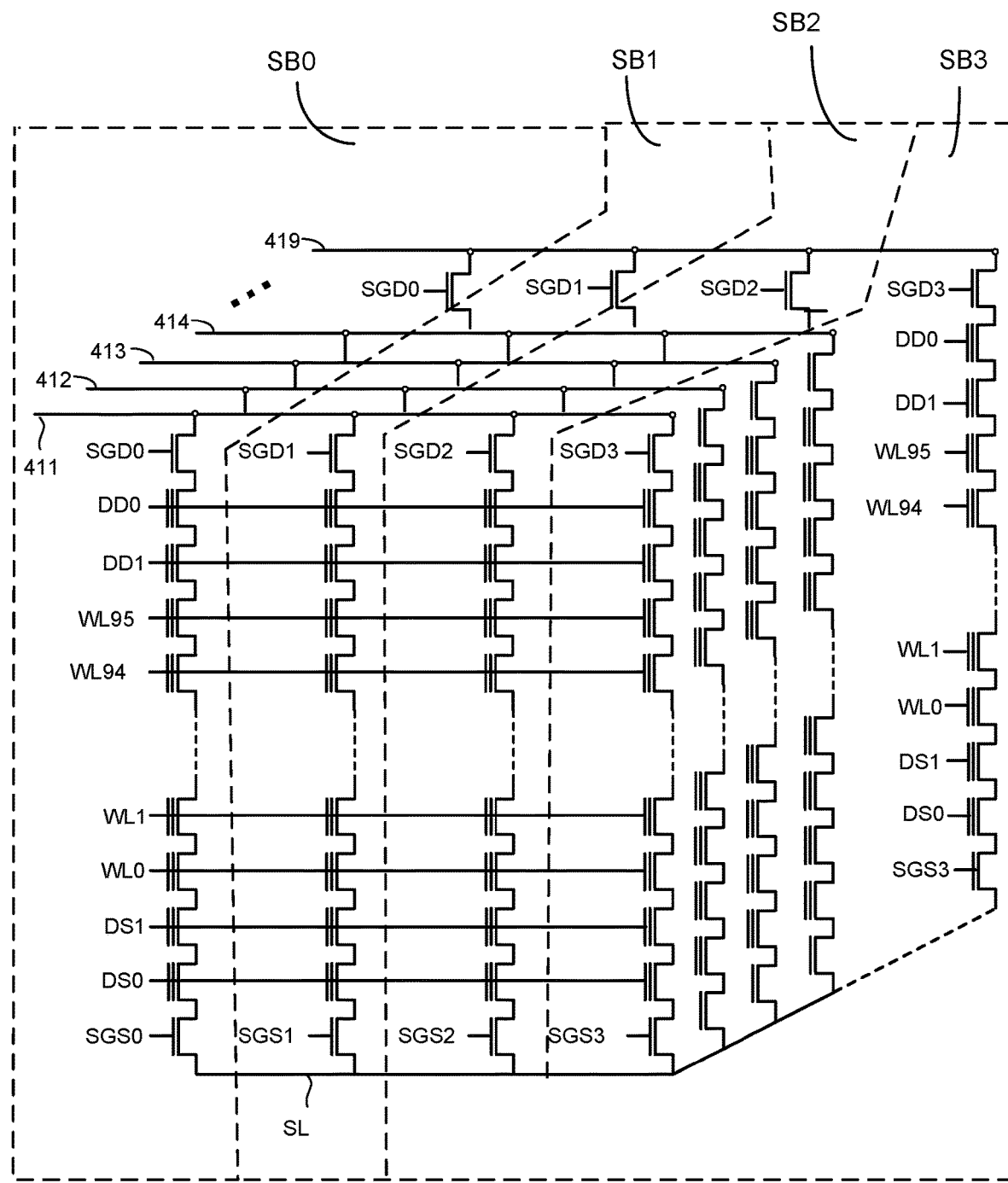
FIG. 4F is a schematic of a plurality of NAND strings showing multiple sub-blocks.

FIG. 4F is a schematic diagram of a portion of the memory depicted in in FIGS. 3-4E. FIG. 4F shows physical word lines WLL0-WLL95 running across the entire block. The structure of FIG. 4F corresponds to portion 306 in Block 2 of FIGS. 4A-E, including bit lines 411, 412, 413, 414, . . . . 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Figure 4G:
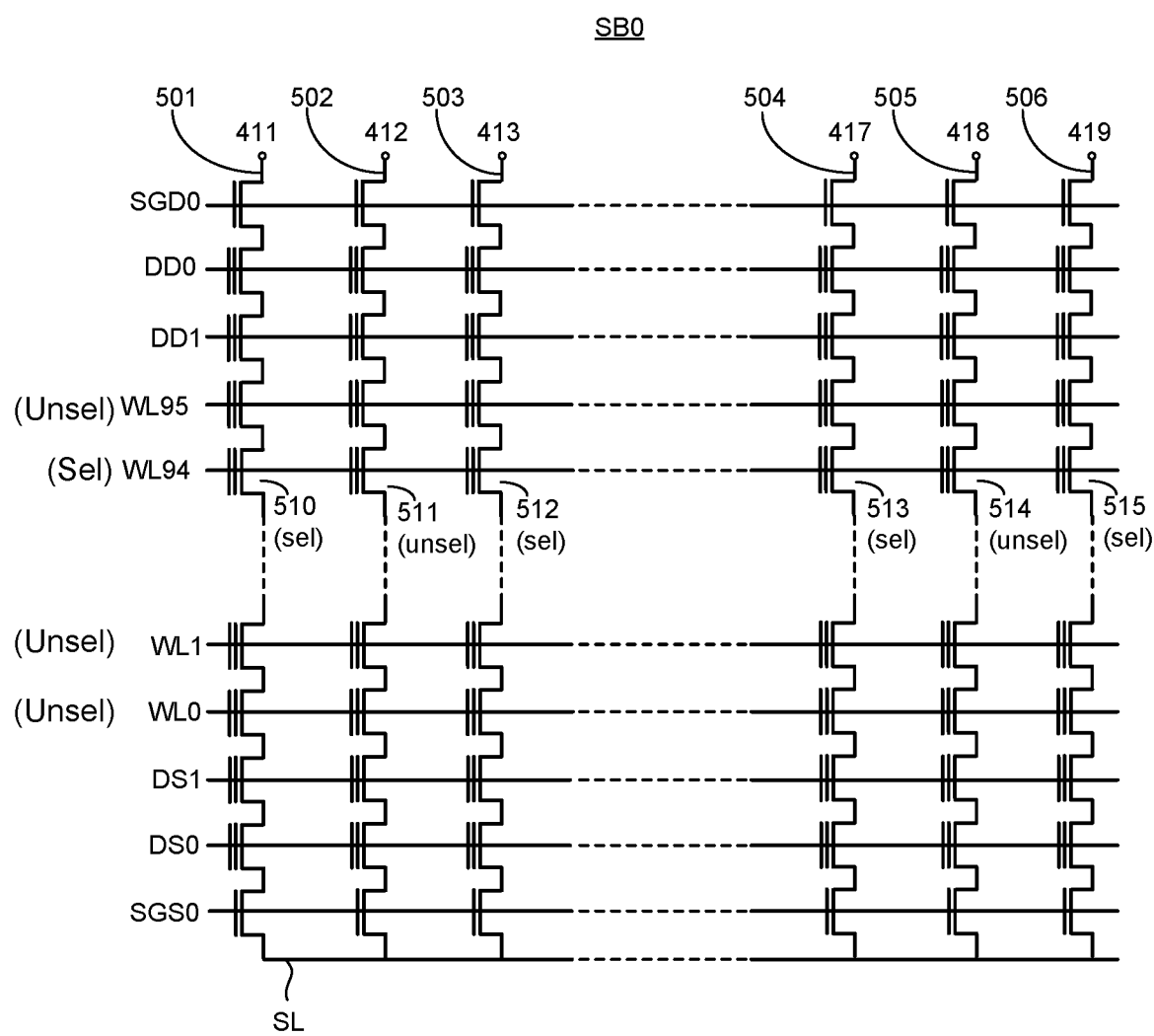
FIG. 4G is a schematic of a plurality of NAND strings showing one sub-block.

FIG. 4G is a schematic of sub-block SB0. Sub-blocks SB1, SB2 and SB3 have similar structures. FIG. 4G shows physical word lines WL0-WL95 running across the entire sub-block S0. All of the NAND strings of sub-block S0 are connected to SGD0 and SGS0. FIG. 4G only depicts six NAND stings 501, 502, 503, 504, 505 and 506; however, sub-block SB0 will have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells while the memory cells that are not intended to take on a new electrical characteristic (or other characteristic) to reflect a changed programming state are referred to as the unselected memory cells. In certain situations, unselected memory cells may be connected to the same word line as selected memory cells. Unselected memory cells may also be connected to different word lines than selected memory cells. Similarly, during a reading process, the set of memory cells to be read are referred to as the selected memory cells while the memory cells that are not intended to be read are referred to as the unselected memory cells.

To better understand the concept of selected memory cells and unselected memory cells, assume a programming operation is to be performed and, for example purposes only, that word line WL94 and sub-block S0 are selected for programming (see FIG. 4G). That means that all of the memory cells connected to WL94 that are in sub-blocks SB1, SB2 and SB3 (the other sub-blocks) are unselected memory cells. Some of the memory cells connected to WL94 in sub-block S0 are selected memory cells and some of the memory cells connected to WL94 in sub-block S0 are unselected memory cells depending on how the programming operation is performed and the data pattern being programmed. For example, those memory cells that are to remain in the erased state S0 will be unselected memory cells, because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to word line WL94) are to remain in the erased state; therefore, memory cells 511 and 514 are unselected memory cells (labeled unsel in FIG. 4G). Additionally, assume for example purposes that memory cells 510, 512, 513 and 515 (which are connected to word line WL94) are to be programmed to any of the data states S1-S7; therefore, memory cells 510, 512, 513 and 515 are selected memory cells (labeled sel in FIG. 4G).

Although the example memory system of FIGS. 3-4G is a three dimensional memory structure that includes vertical NAND strings with charge-trapping material, other (2D and 3D) memory structures can also be used with the technology described herein.

Figures 5, 6:
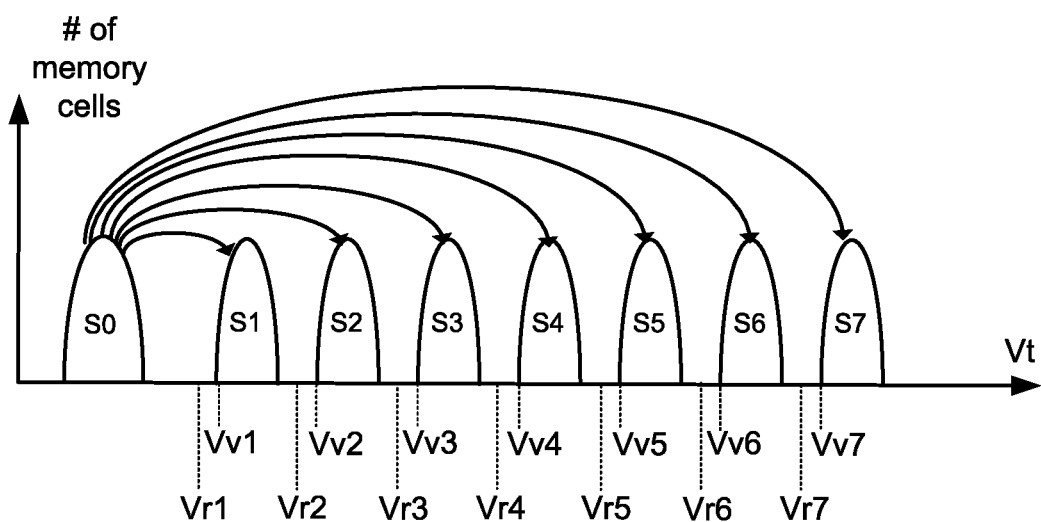
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7. FIG. 5 also shows Vev, which is a voltage level to test whether a memory cell has been properly erased.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-S7 can overlap, with controller 122 relying on error correction to identify the correct data being stored.

FIG. 6 is a table describing one example of an assignment of data values to data states. In the table of FIG. 6, S0=111. S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state. In the embodiment of FIG. 6, all bits stored in a memory cell are 1 when the memory cells is erased (e.g., in data state S0).

Figure 7:
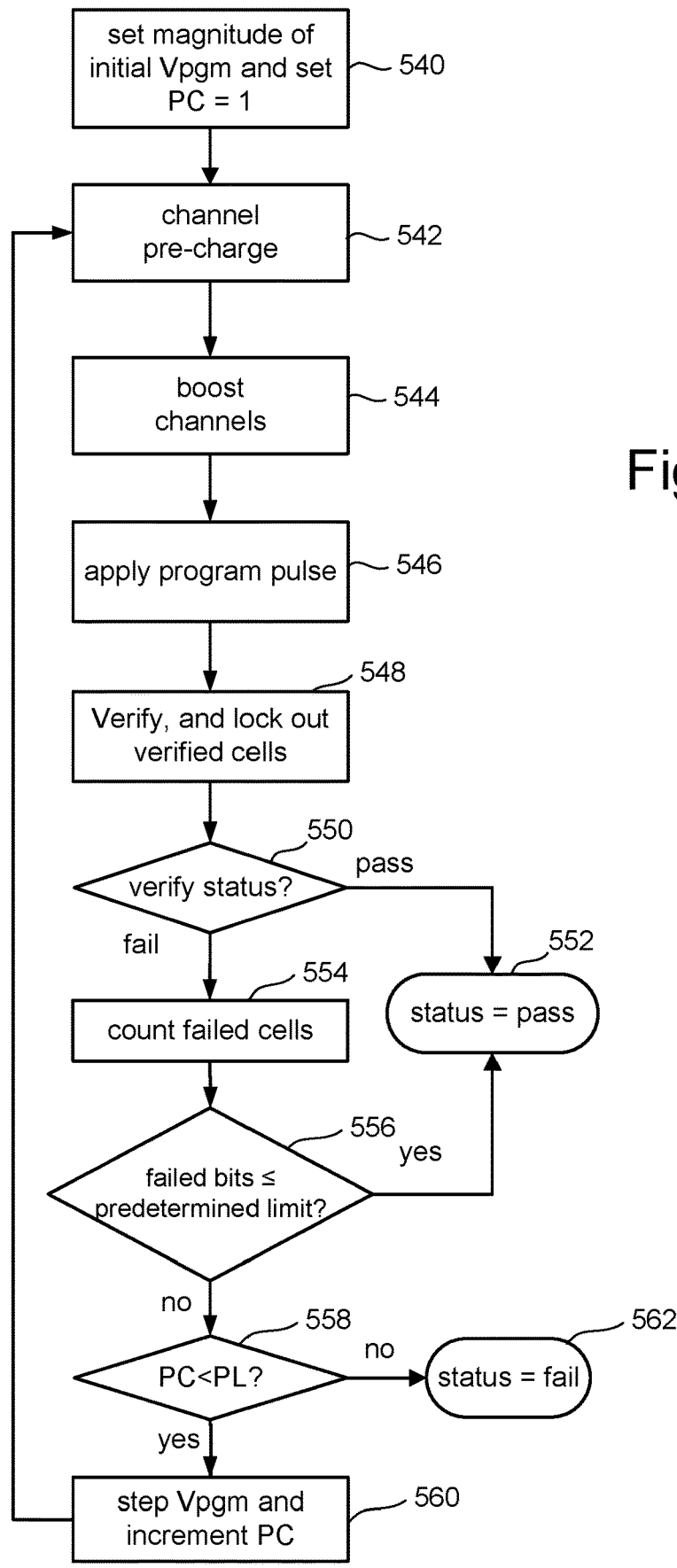
FIG. 7 is a flow chart describing one embodiment of a process for programming non-volatile memory.

FIG. 7 is a flowchart describing one embodiment of a process for programming. In one example embodiment, the process of FIG. 7 is performed on memory die 300 using the control circuit discussed above. For example, the process of FIG. 7 can be performed at the direction of state machine 312. The process of FIG. 7 can also be used to implement the full sequence programming discussed above. Additionally, the process of can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 540 of FIG. 7, the programming voltage (Vpgm) is initialized to the starting magnitude (e.g., ~12-16V or another suitable level) and a program counter PC maintained by state machine 312 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. For example, when data is written to a set of memory cells, some of the memory cells will need to stare data associated with state S0 so they will not be programmed. Additionally, as memory cells reach their intended target data state, they will be inhibited from further programming. Those NAND strings that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 542 the memory system will pre-charge channels of NAND strings that include memory cells connected to the selected word line that are to be inhibited from programming. In some embodiments, only the drain side of the channel is pre-charged. By "drain side" it is meant the portion of the NAND string on the drain side of the selected word line. In other embodiment, the entire channel of the NAD string is pre-charged or some other portion of the channel is pre-charged.

In step 544, NAND strings that include memory cells connected to the selected word line that are to be inhibited from programming have their channels boosted to inhibit programming. In one embodiment, the unselected word lines receive one or more boosting voltages (e.g., ~7-11 volts) to perform boosting schemes known in the art.

In step 546, a program pulse of the program signal Vpgm is applied to the selected word line (the word line selected for programming). If a memory cell should be programmed, then the corresponding bit line is grounded. On the other hand, if the memory cell should remain at its current threshold voltage, then the corresponding bit line is connected to Vdd to inhibit programming. In step 546, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming. In one embodiment, steps 544 and 546 are performed concurrently.

In step 548, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 550, it is determined whether all the memory cells have reached their target threshold voltages (pass). If so, the programming process is complete and successful because all selected memory cells were programmed and verified to their target states. A status of "PASS" is reported in step 552. If, in step 550, it is determined that not all of the memory cells have reached their target threshold voltages (fail), then the programming process continues to step 554.

In step 554, the memory system counts the number of memory cells that have not yet reached their respective target threshold voltage distribution. That is, the system counts the number of memory cells that have, so far, failed the verify process. This counting can be done by the state machine, the Controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 556, it is determined whether the count from step 554 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 552. In this situation, enough memory cells programmed correctly such that the few remaining memory cells that have not been completely programmed can be corrected using ECC during the read process. In some embodiments, the predetermined limit used in step 556 is below the number of bits that can be corrected by error correction codes (ECC) during a read process to allows for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 558 and the program counter PC is checked against the program limit value (PL). Examples of program limit values include 6, 12, 16, 20 and 30; however, other values can be used. If the program counter PC is not less than the program limit value PL, then the program process is considered to have failed and a status of FAIL is reported in step 562. If the program counter PC is less than the program limit value PL, then the process continues at step 560 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 560, the process loops back to step 542 and another program pulse is applied to the selected word line so that another iteration (steps 542-560) of the programming process of FIG. 7 is performed.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 5) or verify operation (e.g. see verify target levels Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Program disturb is a condition that includes the unintended programming of one or more locations in a memory system while performing a programming process for other locations in the memory system. Such unintended programming can cause an error in the data being stored. In some cases, program disturb can result from electrons trapped in the channel being accelerated from one side of a dummy word line to another side of the dummy word line and redirected into a select gate. This phenomena is depicted in FIGS. 8A and 8B.

Figure 8A:
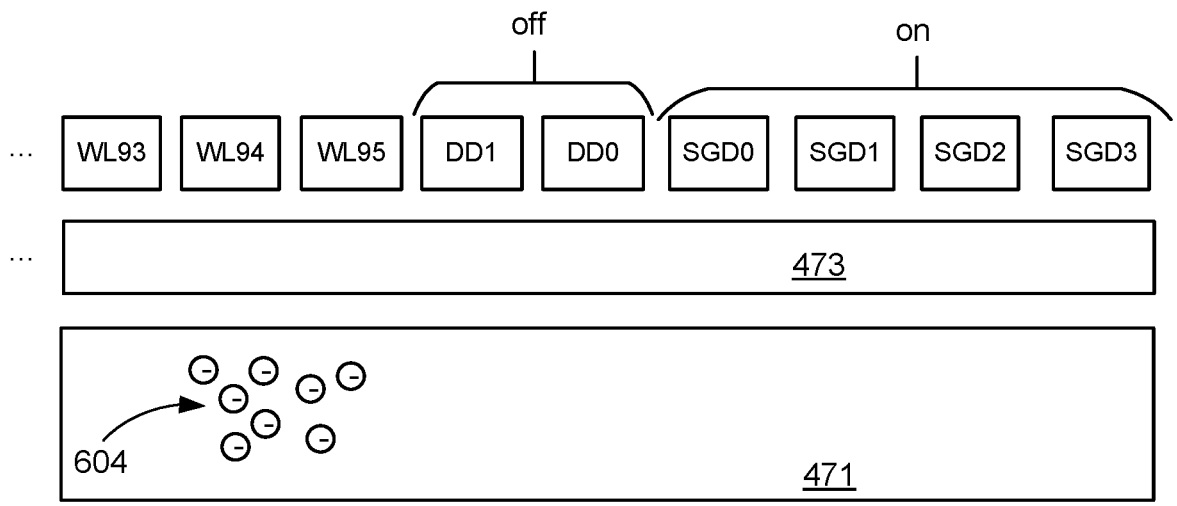
FIGS. 8A and 8B show a cross section of an unselected NAND string.

FIG. 8A depicts a portion of an unselected NAND string. The unselected NAND string of FIG. 8A is a NAND string that has a memory cell that is both connected to the selected word line and is to be inhibited from programming. The NAND string of FIG. 8A is connected to word lines WL0-WL95; however, only WL93-95 are depicted in the drawing. The NAND string of FIG. 8A includes dummy word lines DD0 and DD1 and four selection lines SGD0, SGD1, SGD2 and SGD3. FIG. 8A also shows a portion of the channel 471 and charge trapping layer 473.

Figure 8B:
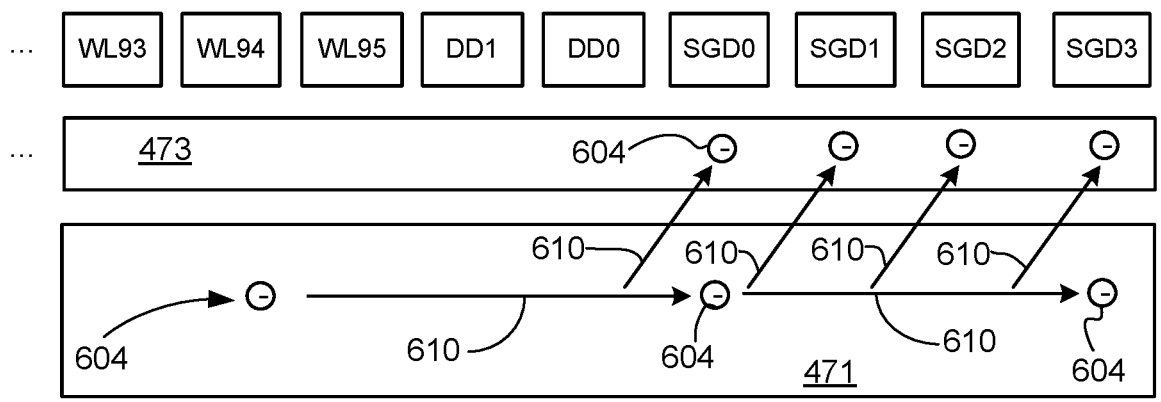

FIG. 8B depicts the same NAND string as FIG. 8A, at a different moment in time. For example, FIG. 8A shows the NAND string at the end of a program verify operation (e.g., step 548 of FIG. 7) and FIG. 8B shows the NAND string at the beginning of the next channel pre-charge (e.g., step 542 of FIG. 7).

In some embodiments, the threshold voltage of the select gates (e.g., connected to SGD0, SGD1, SGD2, SGD3) is the same as the dummy memory cells. It is possible, however, due to electrons drifting or other phenomena, that the threshold voltage of the dummy memory cells unintentionally increases over time. When that happens, the threshold voltage of the dummy memory cells becomes higher than the threshold voltage of the select gates, which can lead to the dummy memory cells turning on and off at different times than expected. FIG. 8A shows the NAND string at the end of a program verify operation (e.g., step 548) when the threshold voltage of the dummy memory cells unintentionally increased over time such that the threshold voltage of the dummy memory cells is now higher than expected. When the program verify operation is finishing, the various word line and select line voltages are brought down to zero volts. Because the threshold voltage of the dummy memory cells is higher than expected, the dummy memory cells are likely to turn off earlier than expected and in this case before the select gates. This situation is depicted in FIG. 8A, which shows the dummy memory cells connected to DD0 and DD1 being off, while the select gates connected to SGD0, SGD1, SGD2 and SGD3 are still on. As a result, the channel is cut off underneath the dummy memory cells such that charge (electrons 604) are trapped in the channel on the source side of the dummy word lines. The trapped electrons can survive a longer time at lower temperature as carrier generation or neutralization is weaker at low temperature.

At the next iteration of the pre-charging of step 542 of FIG. 7, voltages will be applied to the data word lines, the dummy word lines and the select lines that will cause the trapped electrons 604 to be accelerated across the channel toward the select gates. This situation is depicted in FIG. 8B. Some portion of the trapped electrons being accelerated across the channel will experience hot electron injection into charge trapping layer 473 at the select gates (see arrows 610); thereby unintentionally increasing the threshold voltage of the select gates. Changing the threshold voltage of the select gates may change the behavior of the select gates and cause errors during programming, erasing and reading of memory cells in the NAND string. To remedy this problem, it is proposed to apply an activation voltage to the dummy word lines (which are adjacent to at least one of the selection lines) prior to the pre-charging of the channels of unselected NAND strings to open up the channels and allow the trapped electrons to escape the channels (via the bit lines) prior to applying subsequent voltages that result in the hot electron injection discussed above. In one embodiment, a control circuit is configured to pre-charge the channel for a set of memory cells prior to the applying the boosting signals by applying a selection voltage to the select gate while applying one or more pre-charge voltages to at least a subset of the unselected word lines and turning on the dummy memory cell prior to applying the selection voltage to the select gate.

Figure 9:
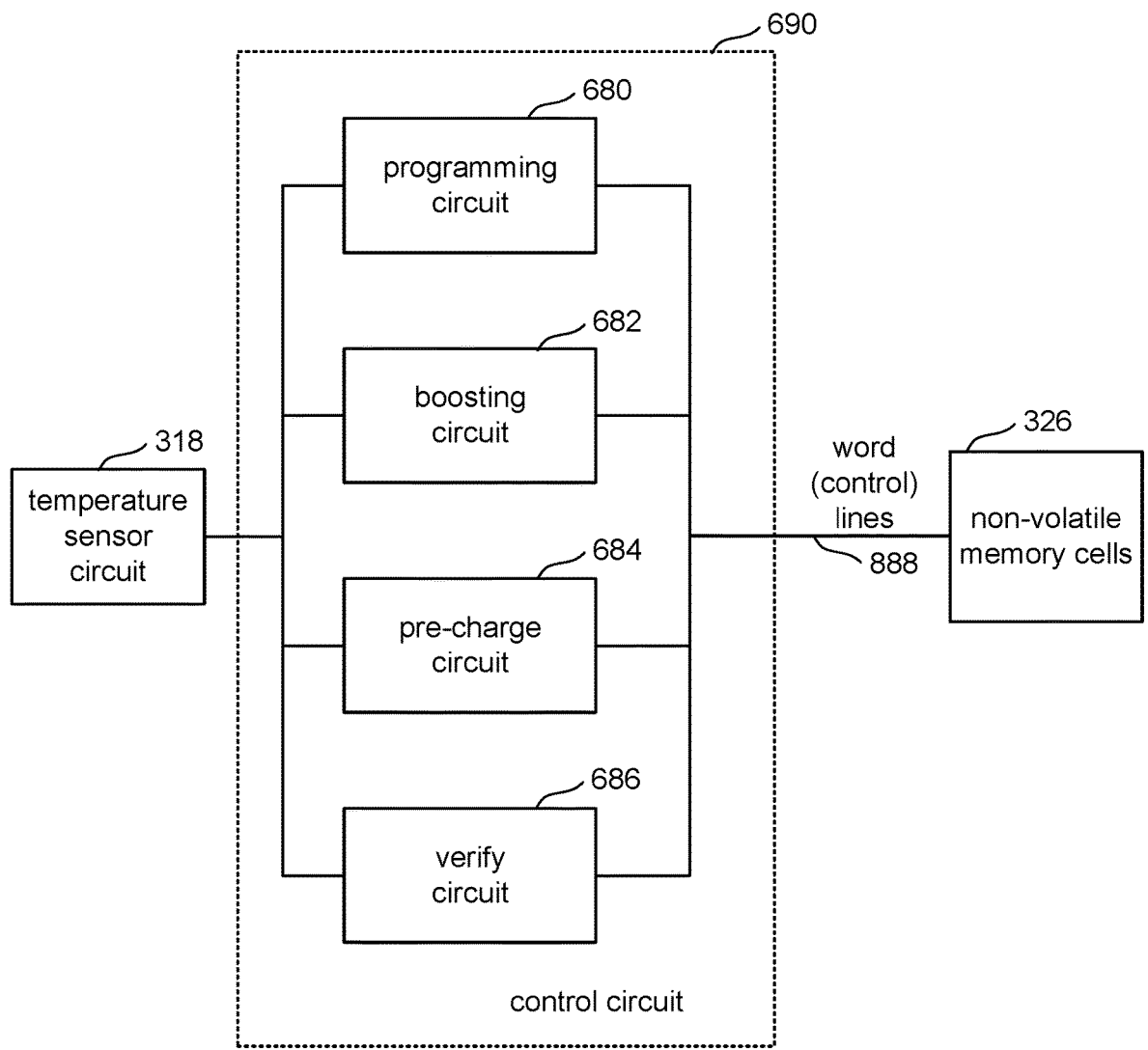
FIG. 9 is a logical block diagram depicting one embodiment of various circuits used to perform the processes described herein.

FIG. 9 is a logical block diagram depicting various electrical circuits used to perform the process of FIG. 7 and that can implement the proposal discussed herein to apply an activation voltage to the dummy word lines prior to the pre-charging of the channels of unselected NAND strings. In one embodiment, all of the circuits depicted in FIG. 9 are resident on the memory die 300. In other embodiments, one or more of the circuits are located off the memory die, such as (for example) on controller 120 or elsewhere. FIG. 9 shows programming circuit (or write circuit) 680, boosting circuit 682, pre-charge circuit 684 and verify circuit 686 all connected to word lines 688 and temperature sensor circuit 318. Word lines 688, which correspond to WL0-WL95 discussed above, are connected to non-volatile memory cells of memory structure 326. Therefore, circuits 680-686 are connected to the non-volatile memory cells of memory structure 326. In one embodiment, memory structure 326 comprises a plurality of non-volatile memory cells, a plurality of select gates, and a plurality of channels that are each connected to memory cells and a select gate.

In one embodiment, programming circuit (or write circuit) 680, boosting circuit 682, pre-charge circuit 684 and verify circuit 686 together form control circuit 690, which can be part of control circuitry 310 (e.g., state machine 312) or controller 120. In one embodiment, circuits 680-686 are part of state machine 312 (or a microcontroller). Programming circuit 680 performs programming (writing) on the non-volatile memory cells of memory structure 326, including applying the program pulse in step 546 and performing steps 540 and 558-562 of FIG. 7 in order to program selected memory cells during the programming process. Boosting circuit 682 performs the boosting of the voltage of the channels of unselected NAND strings, including applying the boosting signals during step 544 of FIG. 7. Thus, boosting circuit 682 is configured to boost voltage of channels for unselected memory cells during the programming process. Pre-charge circuit 684 performs the pre-charging of the channels of unselected NAND strings, including applying the pre-charge signals during step 542 of FIG. 7. Verify circuit 686 performs the program verify process of steps 548-556 of FIG. 7, including managing the Sense Blocks 350 (see FIG. 2). In order to implement the proposal discussed herein to apply an activation voltage to the dummy word lines prior to the pre-charging of the channels of unselected NAND strings, pre-charge circuit 684 is configured to pre-charge the channels for unselected memory cells for the boosting by applying a selection voltage to the selection line, applying a pre-charge voltage to at least a subset of unselected word lines and applying an activation voltage to a word line adjacent to the selection line prior to applying the selection voltage to the selection line. In one embodiment, the word line adjacent to the selection line is the dummy word line describe above. In other embodiments, the word line adjacent to the selection line is a data word line.

Figure 10:
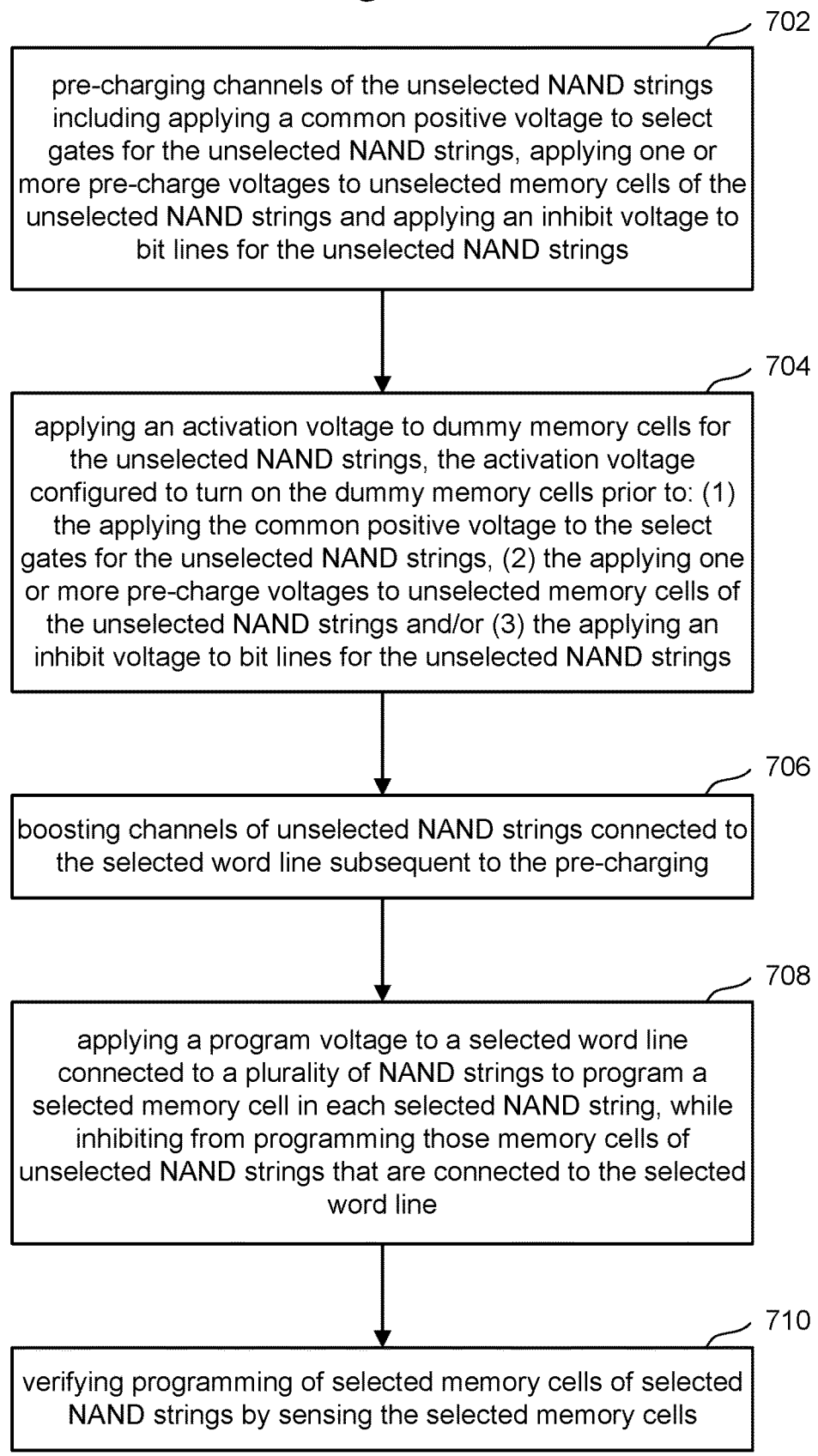
FIG. 10 is a flow chart describing one embodiment of a process for pre-charging, boosting and programming.

FIG. 10 is a flow chart describing one embodiment of a process for pre-charging, boosting and programming that implements the proposed countermeasure for the above-described program disturb by applying an activation voltage to the dummy word lines prior to the pre-charging of the channels of unselected NAND strings. As discussed above, one example of program disturb involves acceleration and redirection (hot electron injection) of electrons. The process of FIG. 10 attempts to separate the acceleration and redirection. The acceleration is caused by a voltage potential difference between the source and drain sides of the channel. Thus, the process of FIG. 10 attempts to remove that potential difference. In one embodiment, the process of FIG. 10 is performed by the components of FIG. 9 and/or the components of FIG. 2. For example, the process of FIG. 10 can be performed by control circuit 690 (which can be a state machine, microprocessor, microcontroller, etc.).

In step 702 of FIG. 10, control circuit 702 pre-charges channels of the unselected NAND strings including applying a common positive voltage to select gates for the unselected NAND strings, applying one or more pre-charge voltages to unselected memory cells of the unselected NAND strings and applying an inhibit voltage to bit lines for the unselected NAND strings. In one embodiment, step 702 of FIG. 10 is an example embodiment of step 542 of FIG. 7.

In step 704 of FIG. 10, control circuit 702 applies an activation voltage to dummy memory cells for the unselected NAND strings. The activation voltage is configured to turn on the dummy memory cells prior to: (1) the applying the common positive voltage to the select gates for the unselected NAND strings, (2) the applying one or more pre-charge voltages to unselected memory cells of the unselected NAND strings and/or (3) the applying an inhibit voltage to bit lines for the unselected NAND strings. In one embodiment, step 704 of FIG. 10 is part of step 542 of FIG. 7 or is performed prior to step 542 of FIG. 7. In one embodiment, the applying the activation voltage to dummy memory cells includes ramping up gates of the dummy memory cells to the activation voltage and holding the gates of the dummy memory cells at the activation voltage for a period of time prior to starting to ramp up the select gates to the common positive voltage for the pre-charging.

In step 706 of FIG. 10, control circuit 702 boosts channels of unselected NAND strings connected to the selected word line subsequent to the pre-charging. In one embodiment, step 706 of FIG. 10 is an example embodiment of step 544 of FIG. 7.

In step 708 of FIG. 10, control circuit 702 applies a program voltage to a selected word line connected to a plurality of NAND strings to program a selected memory cell in each selected NAND string, while inhibiting from programming those memory cells of unselected NAND strings that are connected to the selected word line. In one embodiment, step 708 of FIG. 10 is an example embodiment of step 546 of FIG. 7.

In step 710 of FIG. 10, control circuit 702 verifies programming of selected memory cells of selected NAND strings by sensing the selected memory cells. In one embodiment, step 710 of FIG. 10 is an example embodiment of steps 550-558 of FIG. 7.

Figure 11:
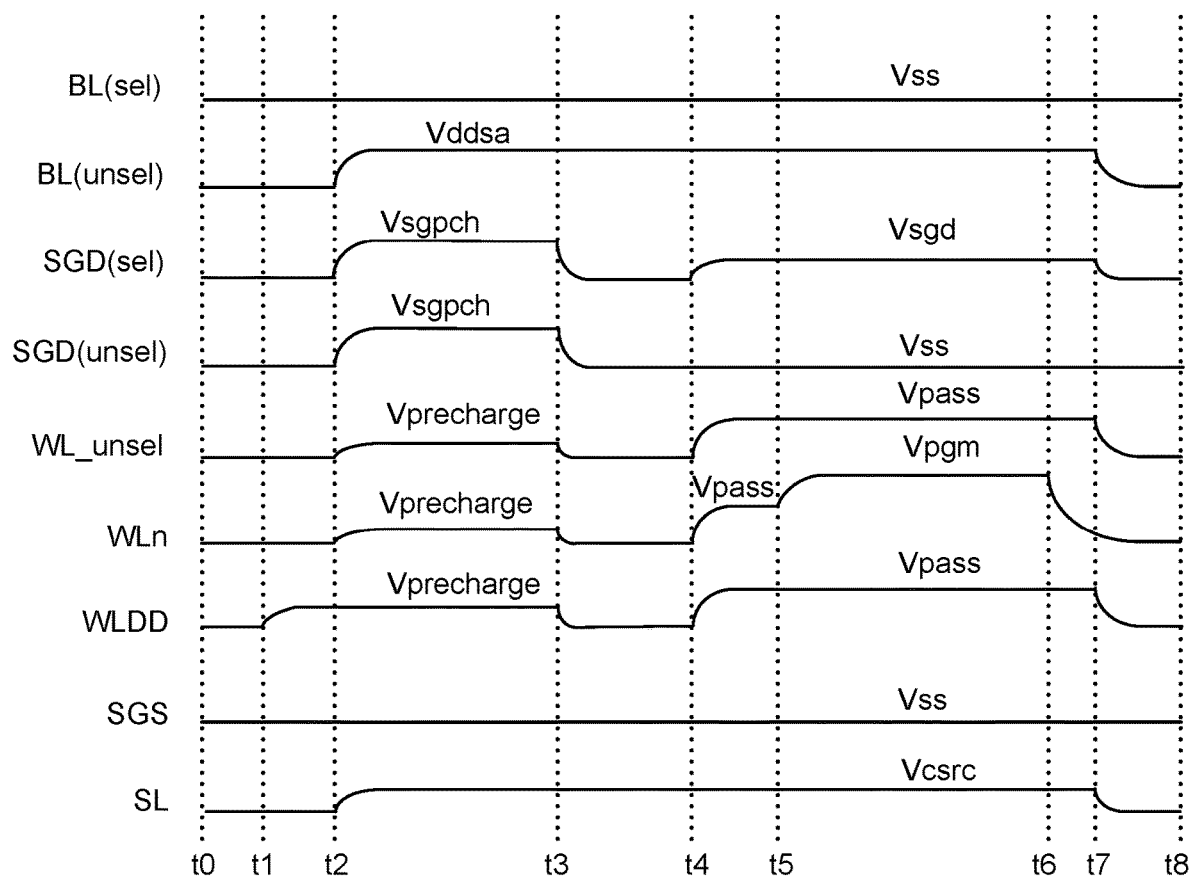
FIG. 11 is a signal diagram describing the behaviors of various signals while pre-charging, boosting and programming.

FIG. 11 is a signal diagram depicting the behavior of various signals during pre-charge, boosting and programming. Thus, FIG. 11 shows behavior of signals during steps 542, 544 and 546 of FIG. 7 as well as during the process of FIG. 10. The signals depicted in FIG. 11 include the selected bit lines BL(sel), unselected bit lines BL(unsel), drain side selection line SGD(sel) for a selected sub-block, drain side select lines SGD(unsel) for unselected sub-blocks, unselected data word lines WL_unsel, the selected word line WLn, the drain side dummy word lines WLDD (e.g., DD0 and DD1), source side select lines SGS and source line SL. The selected bit lines BL(sel) are connected to NAND strings that are selected for programming. The unselected bit lines BL(unsel) are connected to NAND strings that are not selected for programming.

FIG. 11 depicts the various signals when the control circuit is configured to program a memory cell of a first set of memory cells connected to a selected word line and inhibit programming for a memory cell of the second set of memory cells connected to the selected word line by applying a programming signal to the selected word line (WLn) and applying boosting signals to unselected word lines (WL_unsel) to boost a channel for the second set of memory cells, and the control circuit is configured to pre-charge the channel for the second set of the memory cells prior to the applying the boosting signals by applying a selection voltage to the select gate while applying one or more pre-charge voltages to at least a subset of the unselected word lines and turning on the dummy memory cell (e.g., drain side dummy memory cell) prior to applying the selection voltage to the select gate.

In one embodiment, the control circuit is configured to pre-charge the channel for the second set of the memory cells by turning on the dummy memory cell prior to the applying one or more pre-charge voltages to the subset of the unselected word lines (which are data word lines).

In one embodiment, the control circuit is configured to pre-charge the channel for the second set of the memory cells by applying an inhibit voltage to the bit line while applying the one or more pre-charge voltages to the subset of the unselected word lines. The inhibit voltage applied to the bit line causes the select gate to turn off. The control circuit is configured to turn on the dummy memory cell prior to applying the inhibit voltage to the bit line.

In one embodiment, the control circuit is configured to turn on the dummy memory cell prior to applying the selection voltage to the select gate by ramping up voltage to the dummy memory cell until the dummy memory cell reaches the activation voltage and maintains the activation voltage at the dummy memory cell for a period of time prior to starting to ramp up the select gate to the selection voltage, as depicted in FIG. 11.

At time t0 of FIG. 11 all the depicted signals are at 0 volts. The selected bit line BL(sel) and the source side select lines SGS are all at 0 volts (Vss) during the entire time frame depicted in FIG. 11.

The time period of FIG. 11 from t2-t3 corresponds to pre-charging (see step 542 of FIG. 7 and step 702 of FIG. 10). At time t2, the unselected bit lines BL(unsel) are raised to Vddsa (e.g., ~2.5 volts), the drain side select line SGD (sel) connected to selected sub-block is raised to a selection voltage Vsgpch (e.g., ~8 volts), the unselected drain side select line SGD(unsel) is raised to Vsgpch, the selected word line WLn is raised to the pre-charge voltage Vprecharge (e.g. ~3.0 volts) and the unselected word lines WL_unsel are raised to the pre-charge voltage Vprecharge. At time t2, the source line SL is raised to Vcsrc (e.g. ~2.5-3.5 volts). The voltages applied at t1 and t2 cause pre-charging of the channels of unselected NAND strings Prior to the starting the pre-charging (t2-t3), at time t1 the drain side dummy word lines WLDD are raised from 0 volts to Vprecharge and held at Vprecharge until t3. In this embodiment, applying Vprecharge to the drain side dummy word lines WLDD is the applying of the activation voltage to the dummy word lines to activate (i.e., turn on) the dummy memory cells prior to applying the selection voltage to the select gate (e.g. applying Vprecharge to SGD(sel)), prior to applying Vprecharge to the unselected and selected data word lines, and prior to applying Vddsa to the unselected bit line. The raising of WLDD from 0 volts to Vprecharge corresponds to step 704 of FIG. 10. In one embodiment, the time period from t1 to t2 is between 2-8 microseconds. In another embodiment, at time t1 the drain side dummy word lines WLDD are raised from 0 volts to Vpass (e.g., ~7-10 volts). In other embodiments, other voltages can be applied to the dummy word lines as an activation voltages, as long as that activation voltage is sufficient to turn on the dummy memory cells.

In one embodiment, the activation voltage is applied to all dummy word lines. In another embodiment, the activation voltage is only applied to DD0 and DD1 at t1 and to the other dummy word lines at t2. In another embodiment, the activation voltage is only applied to DD0 at t1 and to the other dummy word lines at t2.

At time t3, SGD(sel), SGD(unsel), WLn, WL_unsel, and WLDD are all lowered to Vss (e.g., 0 volts). At this point in time the pre-charge process has completed and the channel of the unselected NAND strings should be pre-charged to a positive voltage.

The time period of FIG. 11 from t4-t7 corresponds to boosting the channels of unselected NAND strings and applying the program signal/pulse (see steps 544 and 546 of FIG. 7, and steps 706 and 708 of FIG. 10. At time t4, the drain side selection line SGD(sel) connected to the selected sub-block is raised to Vsgd (e.g., ~3 volts), the selected word line WLn is raised to a boosting voltage Vpass (e.g., 6-10 volts), the unselected word lines WLunsel are raised to the boosting voltage Vpass, and the drain side dummy word lines WLDD are raised to Vpass. In some embodiments, the source side unselected word lines and the drain side unselected word lines will receive the same boosting voltage Vpass. In other embodiments the source side unselected word lines will receive a boosting voltage that is different from the boosting voltage applied to the drain side unselected word lines; for example, the source side unselected word lines may receive a boosting voltage that is 1-2 volts lower than the boosting voltage applied to the drain side unselected word lines. In some embodiments, each unselected word line will receive a different boosting voltage. Because the bit lines of unselected NAND strings will be at Vddsa, the select gates will cut off the connected bit line from the channel and the boosting voltages (e.g., Vpass) will cause the channel voltage of unselected NAND strings to increase (boosted). Because the channel voltage increases, the differential between the channel voltage and the selected word line will be too small to allow for programming.

At time t5, the voltage applied to the selected word line WLn is raised to the magnitude of the program pulse Vpgm, which can be between 12 and 24 volts, in order to program selected memory cells connected to the selected word line WLn and that are in selected NAND strings connected to selected bit lines BL(sel). In one embodiment, each successive program pulse is higher in magnitude than a previous program pulse by a step size. The program pulse is applied on WLn from t5-t6, which corresponds to one iteration of step 546 of FIG. 7 and step 708 of FIG. 10. At time t6, the selected word line WLn is lowered to ground. At time t7, the unselected bit lines BL(unsel), drain side selection line SGD(sel) for selected sub-blocks, unselected word lines WLunsel, dummy word lines WLD, and source line SL are lowered to ground.

FIG. 11 shows the unselected word lines WLunsel being raised from ground to Vpass at time t4. In another embodiment, the unselected word lines WLunsel are first raised to an intermediate voltages (e.g., such as Vdd, which can be 2.5-3.5 v) and then subsequently raised from the intermediate voltage to the final boosting voltage of Vpass.

Figure 12:
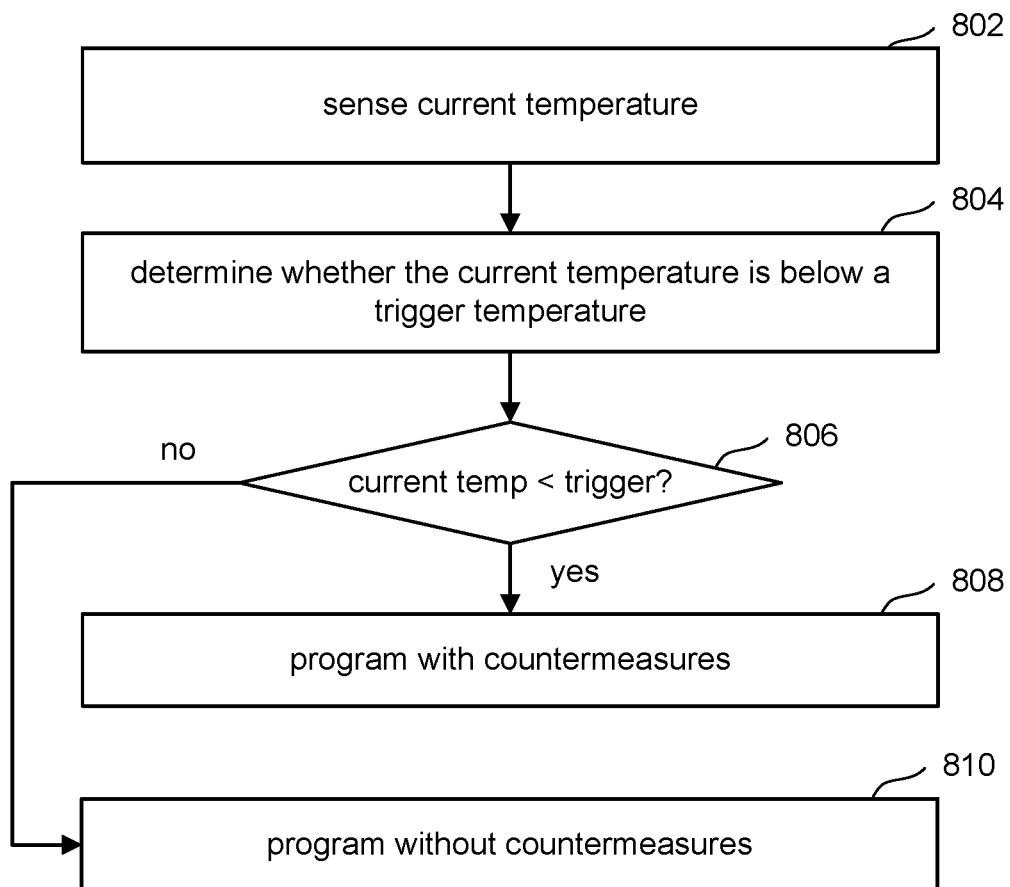
FIG. 12 is a flow chart describing one embodiment of a process for using temperature sensing to turn on/off the countermeasure proposed herein to avoid program disturb to select gates.

FIG. 12 is a flowchart describing one embodiment of implementing the processes of FIGS. 10 and 11. It has been observed that the program disturb phenomenon described herein is more pronounced at lower temperatures. Therefore, in one embodiment, the countermeasure described above is only performed if the current temperature at the memory die is below a predefined trigger temperature. Thus, in step 802, the memory system senses the current temperature using temperature sensing circuit 318. In step 804, memory system determines whether the current temperature is below the trigger temperature. One example of a trigger temperature is −30 C. Other trigger temperatures can also be used. If the current temperature sensed in step 802 is below the trigger temperature (step 806) then in step 808 the system performs the current programming process with the countermeasure. That is, when programming (e.g. performing the process of FIG. 7) the system will perform either the process of FIG. 10. If it is determined in step 806 that the current temperature is not below the trigger temperature, then the memory system will perform the programming (the process of FIG. 7) in step 810 without performing the countermeasure. That is, the process of FIG. 10 will not be used. Thus, pre-charging will be performed without applying the activation voltage to the dummy word line prior to the other voltages.

The proposed technology discussed above, which includes applying an activation voltage to the dummy word lines prior to the pre-charging of the channels of unselected NAND strings to open up the channels and allow the trapped electrons to escape the channels (e.g., migrate from source side channel regions to channel regions of unselected NAND strings underneath or on the drain side of select gates), improves the operation of the memory system by reducing the risk of errors in programming, reading and erasing due to improper operation of the select gates.

One embodiment includes a non-volatile storage system comprising a plurality of non-volatile memory cells including a first set of memory cells and a second set of memory cells, a plurality of word lines connected to the memory cells, and a control circuit connected to the word lines. The second set of memory cells includes a select gate and a dummy memory cell. The control circuit is configured to program a memory cell of the first set of memory cells connected to a selected word line and inhibit programming for a memory cell of the second set of memory cells connected to the selected word line by applying a programming signal to the selected word line and applying boosting signals to unselected word lines to boost a channel for the second set of memory cells. The control circuit is further configured to pre-charge the channel for the second set of the memory cells prior to the applying the boosting signals by applying a selection voltage to the select gate while applying one or more pre-charge voltages to at least a subset of the unselected word lines and turning on the dummy memory cell prior to applying the selection voltage to the select gate.

In one example implementation, the first set of memory cells and the second set of memory cells are part of a monolithic three dimensional memory array comprising a lower set of alternating conductive and dielectric layers and an upper set of alternating conductive and dielectric layers separated by a joint area that together form the plurality of word lines, a plurality of selection lines and a plurality of vertical charge-trapping NAND strings each having a channel. The first set of memory cell and the second set of memory cells are separate NAND strings of the plurality of vertical charge-trapping NAND strings. The dummy memory cell and the select gate are on a same side of the joint area.

One embodiment includes a method comprising applying a program voltage to a selected word line connected to a plurality of NAND strings; boosting channels of unselected NAND strings connected to the selected word line; pre-charging channels of the unselected NAND strings prior to the boosting including applying a common positive voltage to select gates for the unselected NAND strings; and applying an activation voltage to dummy memory cells for the unselected NAND strings, the activation voltage configured to turn on the dummy memory cells prior to the applying the common positive voltage to the select gates for the unselected NAND strings.

One embodiment includes an apparatus comprising a plurality of non-volatile memory cells; a plurality of select gates; a plurality of channels, each channel connected to memory cells and a select gate; a plurality of word lines connected to the memory cells; a selection line connected to the select gates; a programming circuit connected to the word lines, the programming circuit configured to program selected memory cells during a programming process; a boosting circuit connected to the word lines, the boosting circuit configured to boost voltage of channels for unselected memory cells during the programming process; and a pre-charge circuit connected to the word lines and the select line, the pre-charge circuit configured to pre-charge the channels for unselected memory cells for the boosting by applying a selection voltage to the selection line, applying a pre-charge voltage to at least a subset of unselected word lines and applying an activation voltage to a word line adjacent to the selection line prior to applying the selection voltage to the selection line.

One embodiment includes an apparatus comprising a monolithic three dimensional memory array comprising a lower set of alternating conductive and dielectric layers and an upper set of alternating conductive and dielectric layers separated by a joint area that together form a plurality of word lines, selection lines and a plurality of vertical charge-trapping NAND strings each having a channel. The apparatus further comprises means for providing a series of programming pulses to a selected word line to program memory cells connected to the selected word line that are in selected NAND strings; means for boosting the channels of unselected NAND strings; means for pre-charging the channels of unselected NAND strings prior to boosting; and means for applying an activation voltage to one or more dummy word lines adjacent to at least one of the selection lines prior to and during the pre-charging of the channels of unselected NAND strings.

Means for providing a series of programming pulses can include controller 120, control circuitry 310, state machine 312 in combination with power control circuit 316, programming circuit 680 or control circuit 690. The means for providing a series of programming pulses can include dedicated hardware (e.g., electrical circuit), a processor programmed by software, an FPGA, a state machine, a microcontroller or equivalent thereof, as well as voltage generators (e.g., charge pumps). The means for providing a series of programming pulses performs step 546 of FIG. 7 and/or step 708 of FIG. 10, as well as provides the signal WLn of FIG. 11.

Means for boosting the channels of unselected NAND strings can include controller 120, control circuitry 310, state machine 312 in combination with power control circuit 316, boosting circuit 682 or control circuit 690. The means for boosting the channels of unselected NAND strings can be implemented by dedicated hardware (e.g., electrical circuit), a processor programmed by software, an FPGA, a state machine, a microcontroller or equivalent thereof, as well as voltage generators (e.g., charge pumps). The means for boosting the channels of unselected NAND strings performs step 544 of FIG. 7 and/or step 706 of FIG. 10, as well as provides the signal WL_unsel of FIG. 11.

Means for pre-charging the channels can include controller 120, control circuitry 310, state machine 312 in combination with power control circuit 316, pre-charge circuit 684 or control circuit 690. The means for pre-charging the channels can be implemented by dedicated hardware (e.g., electrical circuit), a processor programmed by software, an FPGA, a state machine, a microcontroller or equivalent thereof, as well as voltage generators (e.g., charge pumps). The means for pre-charging the channels performs step 542 of FIG. 7 and/or step 702 of FIG. 10, as well as provides the signals of FIG. 11 between t0-t3 (except WLDD between t0-t2).

Means for applying an activation voltage can include controller 120, control circuitry 310, state machine 312 in combination with power control circuit 316, pre-charge circuit 684 or control circuit 690. The means for applying an activation voltage can be implemented by dedicated hardware (e.g., electrical circuit), a processor programmed by software, an FPGA, a state machine, a microcontroller or equivalent thereof, as well as voltage generators (e.g., charge pumps). The means for applying an activation voltage performs step 704 of FIG. 10, as well as provides the signal WLDD of FIG. 11 between t0-t2.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A method, comprising:
    applying a program voltage to a selected word line connected to a plurality of NAND strings;
    boosting channels of unselected NAND strings connected to the selected word line;
    pre-charging channels of the unselected NAND strings prior to the boosting including applying a common positive voltage to select gates for the unselected NAND strings; and
    applying an activation voltage to dummy memory cells for the unselected NAND strings, the activation voltage configured to turn on the dummy memory cells prior to the applying the common positive voltage to the select gates for the unselected NAND strings.
2. The method according to claim 1, wherein:
    the pre-charging channels of the unselected NAND strings further comprises applying one or more pre-charge voltages to unselected memory cells of the unselected NAND strings; and
    the activation voltage is applied to dummy memory cells for the unselected NAND strings to turn on the dummy memory cells prior to the applying the one or more pre-charge voltages to the unselected memory cells of the unselected NAND strings.
3. The method according to claim 1, further comprising:
    applying an inhibit voltage to bit lines for the unselected NAND strings, the activation voltage is applied to dummy memory cells for the unselected NAND strings to turn on the dummy memory cells prior to applying the inhibit voltage to bit lines for the unselected NAND strings.
4. The method according to claim 1, wherein:
    the dummy memory cells are adjacent the select gates.
5. The method according to claim 1, wherein:
    the applying the activation voltage to dummy memory cells for the unselected NAND strings to turn on the dummy memory cells prior to the applying the common positive voltage to the select gates for the unselected NAND strings includes ramping up gates of the dummy memory cells to the activation voltage and holding the gates of the dummy memory cells at the activation voltage for a period of time prior to starting to ramp up the select gates to the common positive voltage.
6. The method of claim 1, wherein:
    the boosting channels includes applying boosting voltages to unselected word lines prior to applying the program voltage to the selected word line; and
    the pre-charging channels of the unselected NAND strings comprises pre-charging an unprogrammed side of the channels by applying pre-charge voltages to unprogrammed side unselected word lines prior to the applying boosting voltages to unselected word lines.
7. The method of claim 1, wherein:
    the turning on the dummy memory cells prior to the applying the common positive voltage to the select gates for the unselected NAND strings causes electrons to migrate from source side channel regions to channel regions of unselected NAND strings underneath select gates.
8. An apparatus, comprising:
    a plurality of non-volatile memory cells including a first set of memory cells and a second set of memory cells, the second set of memory cells includes a select gate and a dummy memory cell;
    a plurality of word lines connected to the memory cells; and
    a control circuit connected to the word lines, the control circuit configured to program a memory cell of the first set of memory cells connected to a selected word line and inhibit programming for a memory cell of the second set of memory cells connected to the selected word line by applying a programming signal to the selected word line and applying boosting signals to unselected word lines to boost a channel for the second set of memory cells, the control circuit configured to pre-charge the channel for the second set of the memory cells prior to the applying the boosting signals by applying a selection voltage to the select gate while applying one or more pre-charge voltages to at least a subset of the unselected word lines and turning on the dummy memory cell prior to applying the selection voltage to the select gate.
9. The apparatus of claim 8, wherein:
    the dummy memory cell is adjacent the select gate.
10. The apparatus of claim 8, wherein:
    The control circuit configured to pre-charge the channel for the second set of the memory cells by turning on the dummy memory cell prior to the applying one or more pre-charge voltages to the subset of the unselected word lines; and the subset of the unselected word lines are data word lines.

11. The apparatus of claim 8, further comprising:

a bit line connected to the select gate, the control circuit configured to pre-charge the channel for the second set of the memory cells by applying an inhibit voltage to the bit line while applying the one or more pre-charge voltages to the subset of the unselected word lines, the inhibit voltage applied to the bit line causes the select gate to turn off, the control circuit configured to turn on the dummy memory cell prior to applying the inhibit voltage to the bit line.

12. The apparatus of claim 8, wherein:

The control circuit is configured to turn on the dummy memory cell prior to applying the selection voltage to the select gate by ramping up voltage to the dummy memory cell until the dummy memory cell reaches the activation voltage and maintaining the activation voltage at the dummy memory cell for a period of time prior to starting to ramp up the select gate to the selection voltage.

13. The apparatus of claim 8, wherein:

the first set of memory cells is a first NAND string; and the second set of memory cells is a second NAND string.

14. The apparatus of claim 8, wherein:

the first set of memory cells and the second set of memory cells are part of a monolithic three dimensional memory array comprising a lower set of alternating conductive and dielectric layers and an upper set of alternating conductive and dielectric layers separated by a joint area that together form the plurality of word lines, a plurality of selection lines and a plurality of vertical charge-trapping NAND strings each having a channel, the first set of memory cell and the second set of memory cells are separate NAND strings of the plurality of vertical charge-trapping NAND strings;

the dummy memory cell and the select gate are on a same side of the joint area.

15. The apparatus of claim 8, wherein:

the control circuit is configured to turn on the dummy memory cell prior to applying the selection voltage to the select gate in response to determining that a current temperature is below a trigger temperature.

* * * * *